(12) United States Patent
Kanamori et al.

(10) Patent No.: US 11,856,778 B2
(45) Date of Patent: *Dec. 26, 2023

(54) 3D SEMICONDUCTOR MEMORY DEVICE AND METHOD OF FABRICATING SAME

(71) Applicant: SAMSUNG ELECTRONICS CO., LTD., Suwon-si (KR)

(72) Inventors: Kohji Kanamori, Seongnam-si (KR); Jee Hoon Han, Hwaseong-si (KR); Seo-Goo Kang, Seoul (KR); Hyo Joon Ryu, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/983,007

(22) Filed: Nov. 8, 2022

(65) Prior Publication Data

US 2023/0084549 A1 Mar. 16, 2023

Related U.S. Application Data

(63) Continuation of application No. 17/022,525, filed on Sep. 16, 2020, now Pat. No. 11,502,101.

(30) Foreign Application Priority Data

Mar. 16, 2020 (KR) .......................... 10-2020-0031710

(51) Int. Cl.
H10B 43/27 (2023.01)
G11C 8/14 (2006.01)
(Continued)

(52) U.S. Cl.
CPC .............. *H10B 43/27* (2023.02); *G11C 7/18* (2013.01); *G11C 8/14* (2013.01); *H10B 41/10* (2023.02);
(Continued)

(58) Field of Classification Search
CPC .......... H01L 27/11273; H01L 27/1128; H01L 27/11514; H01L 27/11551;
(Continued)

(56) References Cited

U.S. PATENT DOCUMENTS 7,927,926 B2 4/2011 Katsumata et al.
3,507,973 A1 8/2013 Lee
(Continued)

*Primary Examiner* — Amar Movva
(74) *Attorney, Agent, or Firm* — Fish & Richardson P.C.

(57) ABSTRACT

A semiconductor memory device includes; a lower stacked structure including lower metallic lines stacked in a first direction on a substrate, an upper stacked structure including a first upper metallic line and a second upper metallic line sequentially stacked on the lower stacked structure, a vertical structure penetrating the upper stacked structure and lower stacked structure and including a channel film, a connection pad disposed on the vertical structure, contacted with the channel film and doped with N-type impurities, a first cutting line cutting the lower metallic lines, the first upper metallic line and the second upper metallic line, a second cutting line spaced apart from the first cutting line in a second direction different from the first direction, and cutting the lower metallic lines, the first upper metallic line and the second upper metallic line, and sub-cutting lines cutting the first upper metallic line and the second upper metallic line between the first cutting line and the second cutting line. The channel film includes an undoped channel region and a doping channel region, and the doping channel region contacts the connection pad and overlaps a part of the second upper metallic line in the second direction.

20 Claims, 34 Drawing Sheets

(51) Int. Cl.
*G11C 7/18* (2006.01)
*H10B 41/10* (2023.01)
*H10B 41/27* (2023.01)
*H10B 41/40* (2023.01)
*H10B 43/10* (2023.01)
*H10B 43/40* (2023.01)

(52) U.S. Cl.
CPC ............ *H10B 41/27* (2023.02); *H10B 41/40* (2023.02); *H10B 43/10* (2023.02); *H10B 43/40* (2023.02)

(58) Field of Classification Search
CPC ......... H01L 27/11553; H01L 27/11556; H01L 27/11578; H01L 27/1158; H01L 27/11582; H01L 27/11597; H01L 27/2481; H01L 27/249; H10B 20/40; H10B 20/50; H10B 41/20; H10B 41/23; H10B 41/27; H10B 43/20; H10B 43/23; H10B 43/27; H10B 51/20; H01B 53/20; G11C 8/14

See application file for complete search history.

(56) References Cited

U.S. PATENT DOCUMENTS

| | | |
|---|---|---|
| 8,847,302 B2 | 9/2014 | Alsmeier et al. |
| 9,520,408 B2 | 12/2016 | Kim |
| 9,559,113 B2 | 1/2017 | Lai |
| 9,728,266 B1 | 8/2017 | Goda et al. |
| 9,916,901 B1 | 3/2018 | Saito et al. |
| 9,972,640 B1 | 5/2018 | Kai et al. |
| 10,170,188 B1 | 1/2019 | Yip |
| 10,181,341 B1 | 1/2019 | Sakui |
| 10,297,610 B2 | 5/2019 | Kai et al. |
| 2017/0287928 A1 | 10/2017 | Kanamori et al. |
| 2019/0287994 A1 | 9/2019 | Tanaka et al. |
| 2019/0333581 A1 | 10/2019 | Diep et al. |

3D SEMICONDUCTOR MEMORY DEVICE AND METHOD OF FABRICATING SAME

CROSS-REFERENCE TO RELATED APPLICATION

This is a Continuation of U.S. application Ser. No. 17/022,525, filed Sep. 16, 2020, now U.S. Pat. No. 11,502,101, issued Nov. 15, 2022, and a claim of priority is made to Korean Patent Application No. 10-2020-0031710 filed on Mar. 16, 2020, in the Korean Intellectual Property Office, the disclosures of which are incorporated herein by reference in their entireties.

BACKGROUND

1. Field of the Invention

The inventive concept relates generally to semiconductor memory devices and methods of fabricating same. More particularly, the inventive concept relates to three-dimensional (3D) semiconductor memory devices including a vertical channel structure and providing high integration density and improved element performance, as well as methods of fabricating same.

2. Description of the Related Art

In order to satisfy consumer demands for reasonably-priced, high performance electronics, constituent semiconductor memory devices require increased integration density and improved performance. Integration density is primarily determined in two-dimensional or planar semiconductor devices by the area occupied by a unit memory cell. As a result, an increasingly costly array of fine pattern fabrication technique(s) and related equipment are required. However, the ultra-expensive equipment required for further miniaturization of fine patterns has reached an economic limit. Accordingly, 3D semiconductor memory devices have become an important field of research and development.

SUMMARY

Embodiments of the inventive concept provide 3D semiconductor memory devices including a vertical channel structure providing increased integration density and improved performance Other embodiments of the inventive concept provide methods of fabricating semiconductor memory devices having these qualities.

In one embodiment the inventive concept provides a semiconductor memory device including; a lower stacked structure including lower metallic lines stacked in a first direction on a substrate, an upper stacked structure including a first upper metallic line and a second upper metallic line sequentially stacked on the lower stacked structure, a vertical structure penetrating the upper stacked structure and lower stacked structure and including a channel film, a connection pad disposed on the vertical structure, contacted with the channel film and doped with N-type impurities, a first cutting line cutting the lower metallic lines, the first upper metallic line and the second upper metallic line, a second cutting line spaced apart from the first cutting line in a second direction different from the first direction, and cutting the lower metallic lines, the first upper metallic line and the second upper metallic line and sub-cutting lines cutting the first upper metallic line and the second upper metallic line between the first cutting line and the second cutting line, wherein the channel film includes an undoped channel region and a doping channel region doped with the N-type impurities, and the doping channel region contacts the connection pad and overlaps a part of the second upper metallic line in the second direction.

In another embodiment the inventive concept provides a semiconductor memory device including; a lower stacked structure including lower metallic lines stacked in a first direction on a substrate, an upper stacked structure including a first upper metallic line and a second upper metallic line sequentially stacked on the lower stacked structure, a vertical structure penetrating the upper stacked structure and lower stacked structure and including a channel film, a connection pad disposed on the vertical structure, contacting the channel film, and doped with N-type impurities, a first cutting line cutting the lower metallic lines, the first upper metallic line and the second upper metallic line, a second cutting line spaced apart from the first cutting line in a second direction different from the first direction, and cutting lower metallic lines, the first upper metallic line and the second upper metallic line and sub-cutting lines cutting the first upper metallic line and the second upper metallic line between the first cutting line and the second cutting line, wherein the channel film includes an undoped channel region and a doping channel region doped with the N-type impurities, a doping channel region of the channel film contacts the connection pad and overlaps a part of the second upper metallic line in the second direction, the lower metallic lines includes a first lower metallic line closest to the first upper metallic line, the undoped channel region includes an upper extension region and a lower extension region extending in the first direction, and a horizontal extension region which connects the upper extension region and the lower extension region and extends in the second direction, and the horizontal extension region is connected to the upper extension region and the lower extension region, between a lower surface of the first lower metallic line and a lower surface of the first upper metallic line.

In another embodiment the inventive concept provides a semiconductor memory device including; a peripheral logic structure including a peripheral circuit on a substrate, a horizontal conductive substrate extending along an upper surface of the peripheral logic structure, a lower stacked structure including lower metallic lines stacked in a first direction, on the horizontal conductive substrate, an upper stacked structure including a first upper metallic line and a second upper metallic line sequentially stacked on the lower stacked structure, a vertical structure penetrating the upper stacked structure and the lower stacked structure and including a channel film, the channel film being electrically connected to the horizontal conductive substrate, a connection pad disposed on the vertical structure, contacting the channel film, and doped with N-type impurities, a first cutting line cutting the lower metallic lines, the first upper metallic line and the second upper metallic line, a second cutting line spaced apart from the first cutting line in a second direction different from the first direction, and cutting the lower metallic lines, the first upper metallic line and the second upper metallic line, and sub-cutting lines cutting the first upper metallic line and the second upper metallic line between the first cutting line and the second cutting line, wherein the sub-cutting lines do not cut the lower metallic line, the channel film includes an undoped channel region and a doping channel region doped with N-type impurities, a doping channel region of the channel film contacting the connection pad and overlapping a part of the second upper metallic line in the second direction, and the vertical structure includes a plurality of width extension regions having respective widths that increase in the second direction as the vertical structure extends away from the connection pad.

BRIEF DESCRIPTION OF THE DRAWINGS

The above and other aspects and features of the inventive concept will become more apparent upon consideration of the following detailed description together with the attached drawings, in which:

FIGS. 21, 22, 23A, 23B, 24, 25A, 25B, 26, 27, 28 and 29 are related, cross-sectional diagrams illustrating in one example a method of fabricating a semiconductor memory device according to embodiments of the inventive concept, wherein, FIGS. 23B and 25B are respective, enlarged views further illustrating the region 'S' of FIGS. 23A and 25A.

DETAILED DESCRIPTION

Throughout the written description and drawings like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
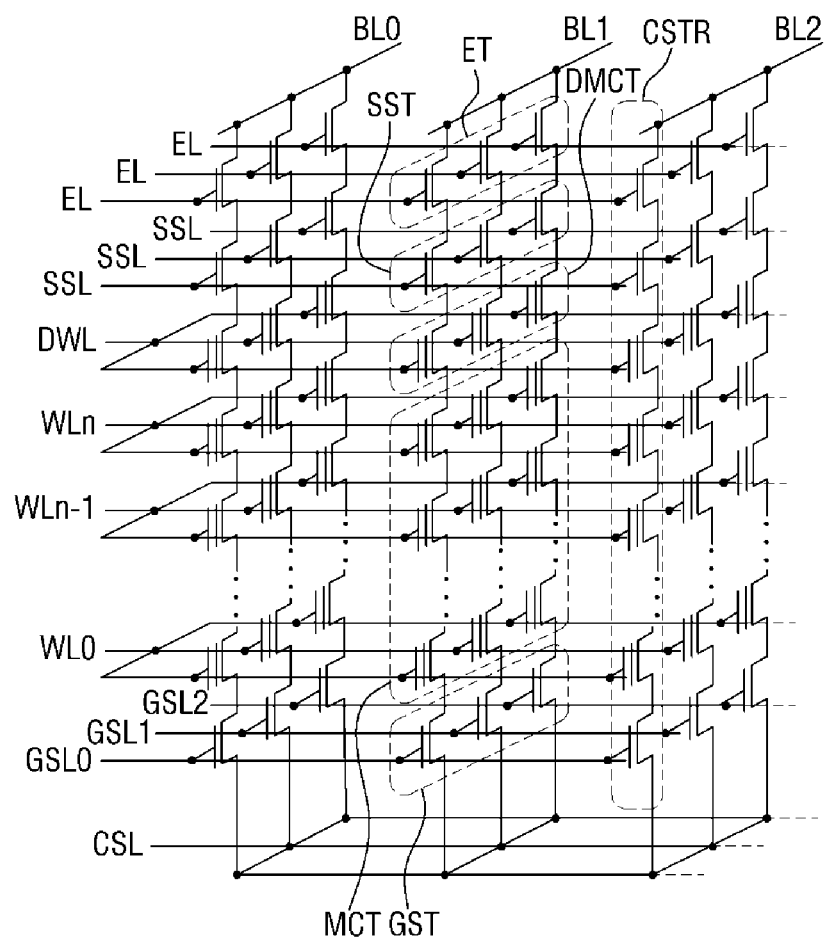
FIG. 1 is a partial circuit diagram generally illustrating a three-dimensional (3D) semiconductor memory device.

FIG. 1 is a partial circuit diagram illustrating a three-dimensional (3D) (or vertical) semiconductor memory device.

Referring to FIG. 1, a memory cell array of the semiconductor memory device according to some embodiments may include a common source line CSL, a plurality of bit lines BL0 to BL2, and a plurality of cell strings CSTR disposed between the common source line CSL and the bit lines BL0 to BL2.

The plurality of cell strings CSTR may be connected in parallel to each of the bit lines BL0 to BL2. The plurality of cell strings CSTR may be commonly connected to the common source line CSL. That is, the plurality of cell strings CSTR may be disposed between the plurality of bit lines BL0 to BL2 and a single common source line CSL. The plurality of common source lines CSL may be arranged two-dimensionally. Here, the same voltage may be electrically applied to the common source lines CSL or each of the common source lines CSL may be electrically controlled.

For example, each cell string CSTR may be made up of an erasing control transistor ET, a string selection transistor SST, serially connected memory cells MCT, and a ground selection transistor GST. Further, each of the memory cells MCT includes a data storage element.

As an example, each cell string CSTR may include the erasing control transistor ET and the string selection transistor SST connected in series. The erasing control transistor ET may be connected to the bit lines BL0 to BL2. The ground selection transistor GST may be connected to the common source line CSL. The memory cells MCT may be connected in series between the string selection transistor SST and the ground selection transistor GST.

Furthermore, each cell string CSTR may further include a dummy cell DMCT connected between the string selection transistor SST and the memory cell MCT. Alternately, the dummy cell DMCT may also be connected between the ground selection transistor GST and the memory cell MCT. As another example, the ground selection transistor GST in each cell string CSTR may be made up of a plurality of serially connected MOS transistors. Further, as another example, each cell string CSTR may also include a plurality of serially connected string selection transistors.

According to some embodiments, the erasing control transistor ET may be controlled by the erasing control line EL, and the string selection transistor SST may be controlled by the string selection line SSL. The memory cells MCT may be controlled by word lines WL0 to WLn, and the dummy cells DMCT may be controlled by a dummy word line DWL. Also, the ground selection transistor GST may be controlled by the ground selection line GSL. The common source line CSL may be commonly connected to the sources of the ground selection transistors GST.

The single cell string CSTR may be made up of a plurality of memory cells MCT having different distances from the common source lines CSL. The word lines WL0 to WLn, and DWL may be disposed between the common source lines CSL and the bit lines BL0 to BL2.

Gate electrodes of the memory cells MCTs, which are disposed at substantially the same distance from the common source line CSL, are commonly connected to one of the word lines WL0 to WLn and DWL, and may be in an equipotential state. Alternatively, even if the gate electrodes of the memory cells MCT are disposed at substantially the same level from the common source lines CSL, the gate electrodes disposed in different rows or columns may be controlled independently.

The ground selection lines GSL0 to GSL2 and the string selection lines SSL may extend, for example in the same direction as the word lines WL0 to WLn and DWL. The ground selection lines GSL0 to GSL2 and the string selection line SSL, which are disposed at substantially the same level from the common source line CSL, may be electrically separated from each other.

Also, the erasing control lines EL disposed at substantially the same level from the common source lines CSL may be electrically separated from each other. Alternatively, the erasing control transistors ET of different cell strings CTSR may be controlled by a common erasing control line EL. The erasing control transistors ET cause gate-induced drain leakage (GIDL) at the time of the erasing operation of the memory cell array. That is, the erasing control transistors ET may be GIDL transistors.

Figure 2:
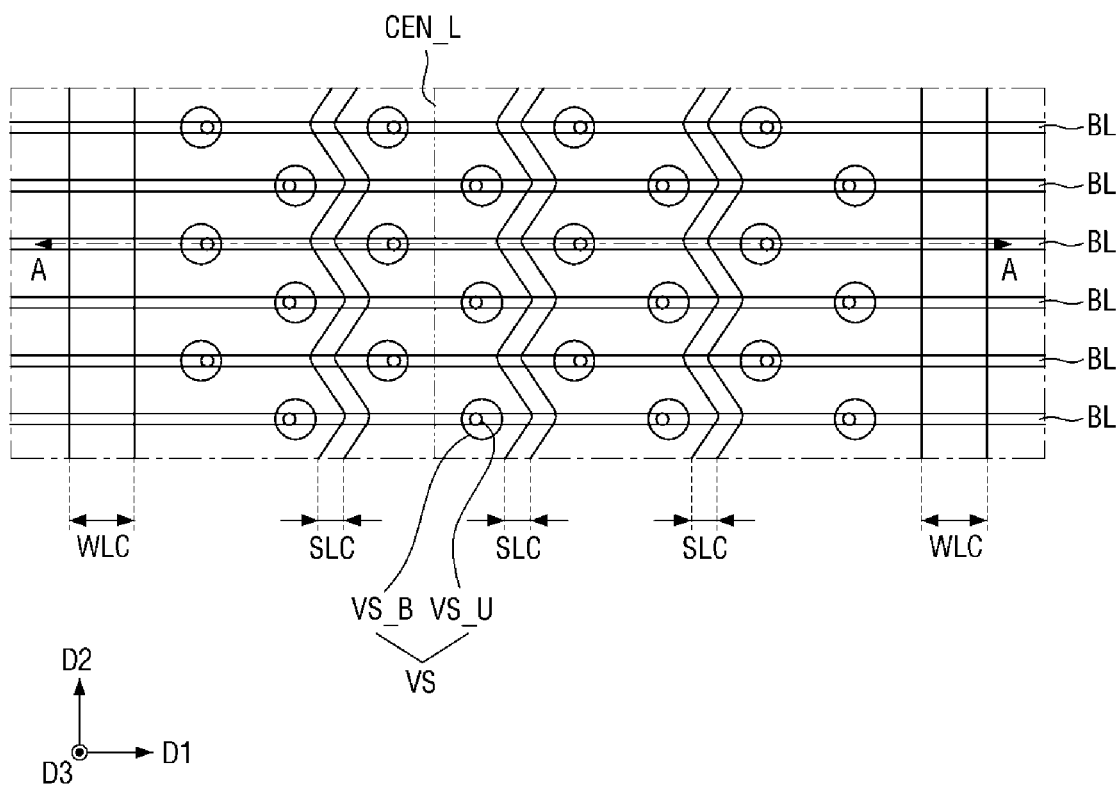
FIG. 2 is a layout diagram (e.g., a plan view or a top-down view) illustrating non-volatile memory devices according to embodiments of the inventive concept.
Figure 3:
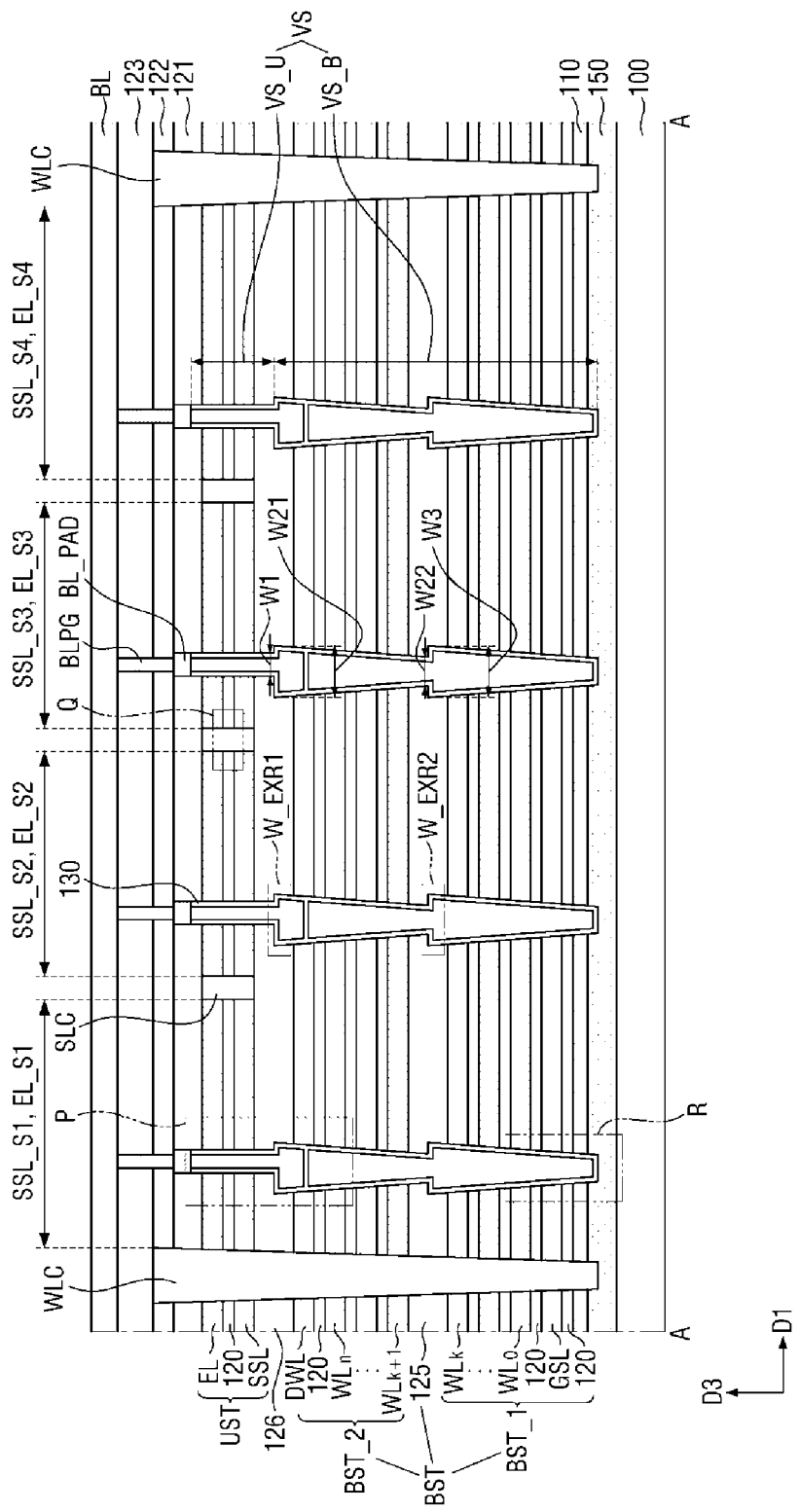
FIG. 3 is a cross-sectional view taken along a line A-A of FIG. 2.
Figure 4A:
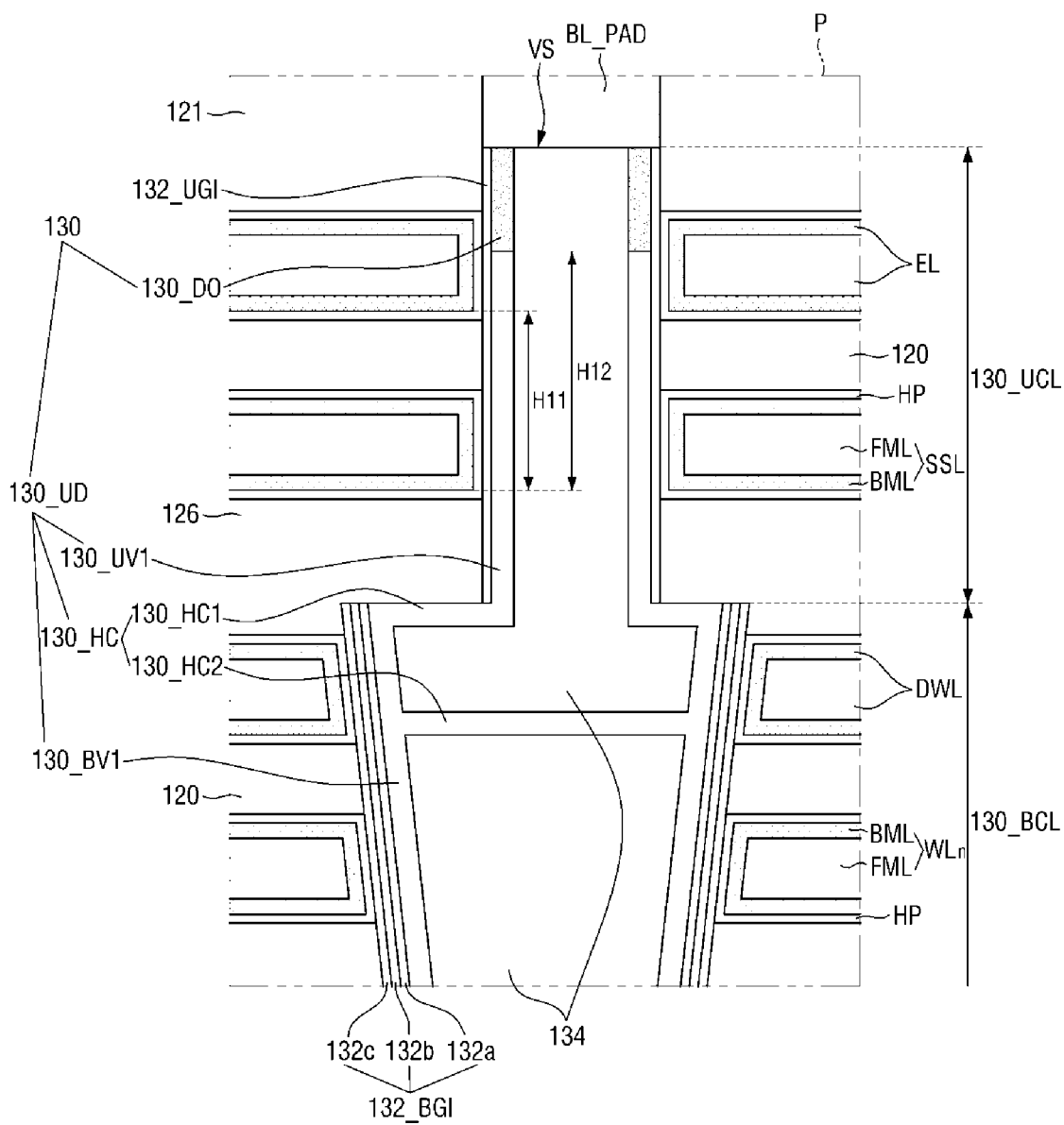
FIGS. 4A and 4B (as well as FIGS. 7A and 7B) are respective, enlarged views of region 'P' of FIG. 3.
Figure 4B:
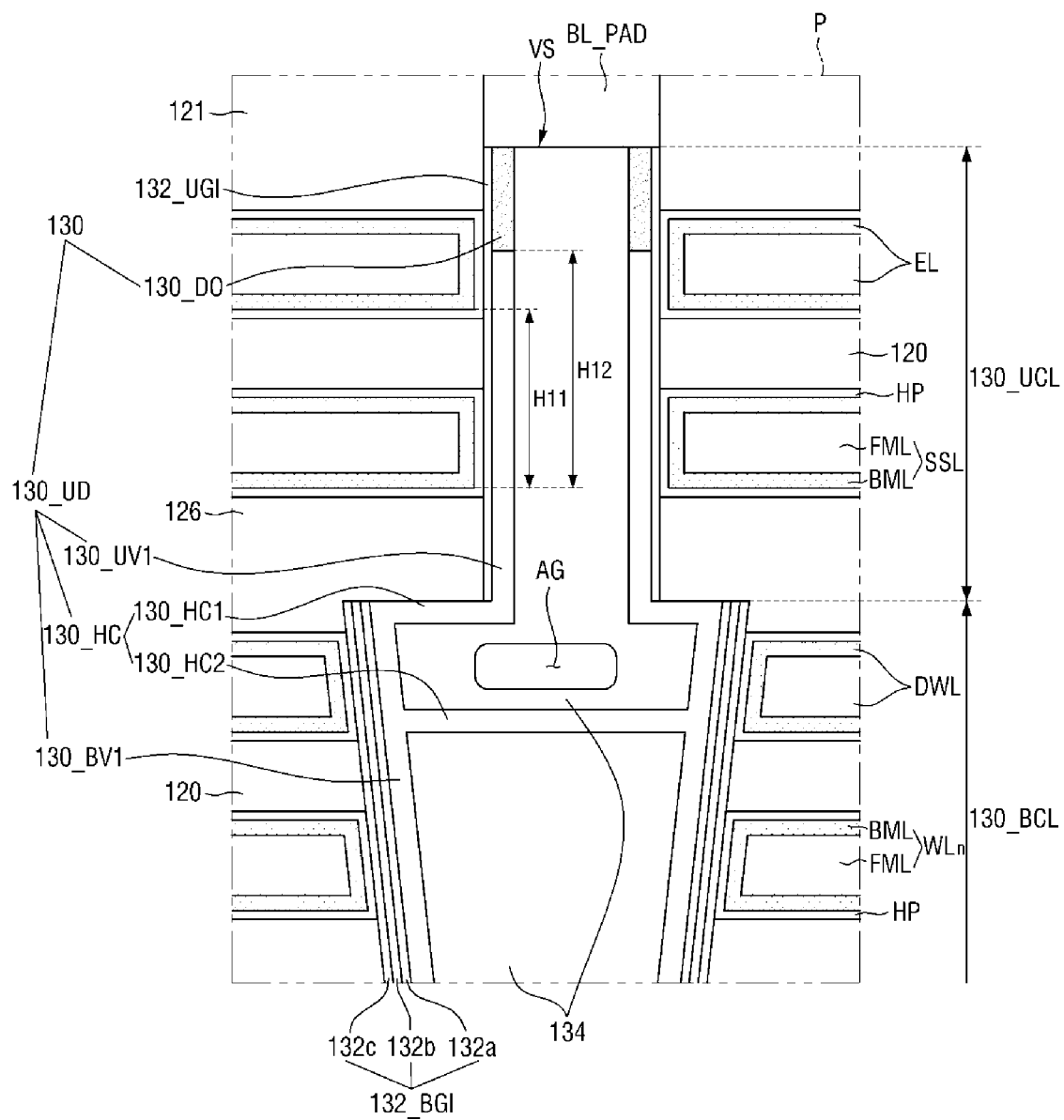
Figure 5A:
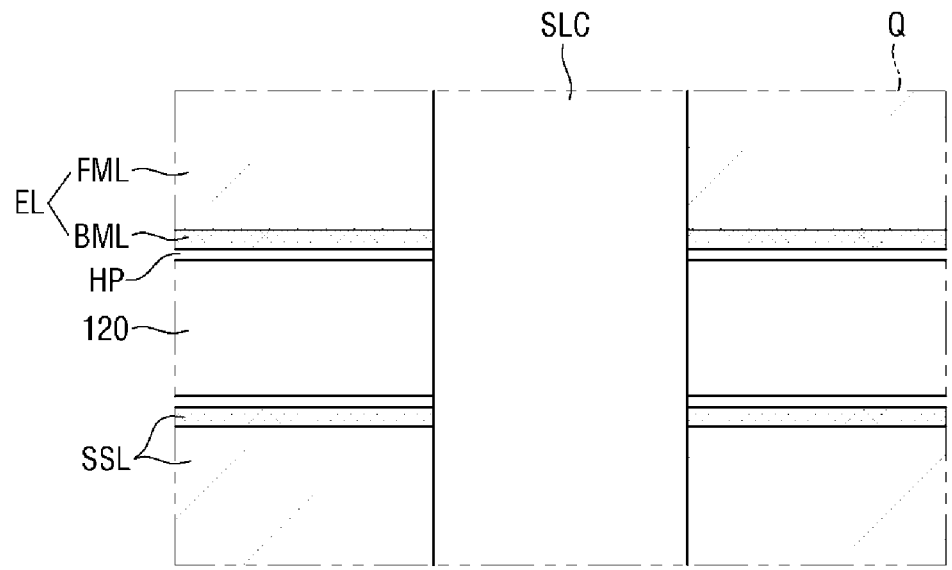
FIGS. 5A and 5B are respective, enlarged views of region 'Q' of FIG. 3.
Figure 5B:
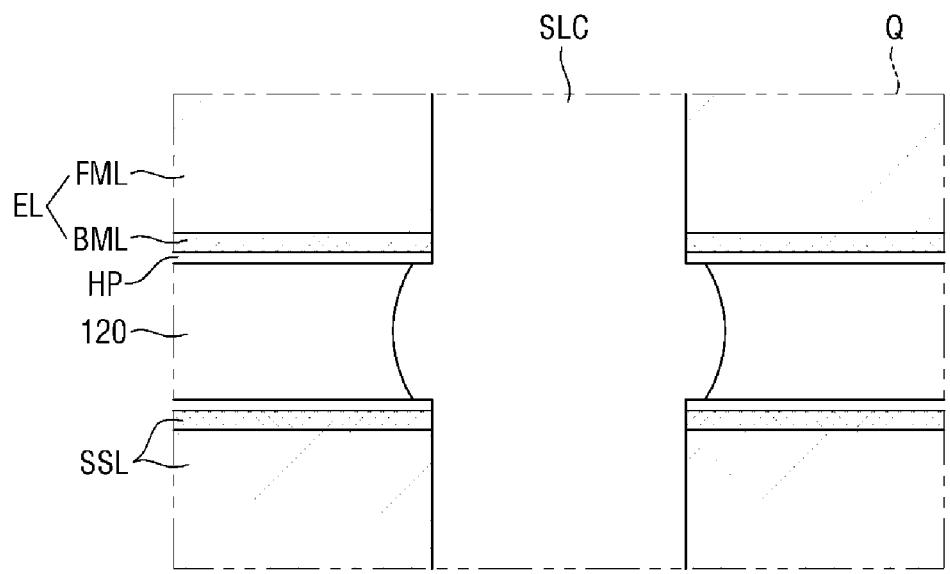
Figure 6A:
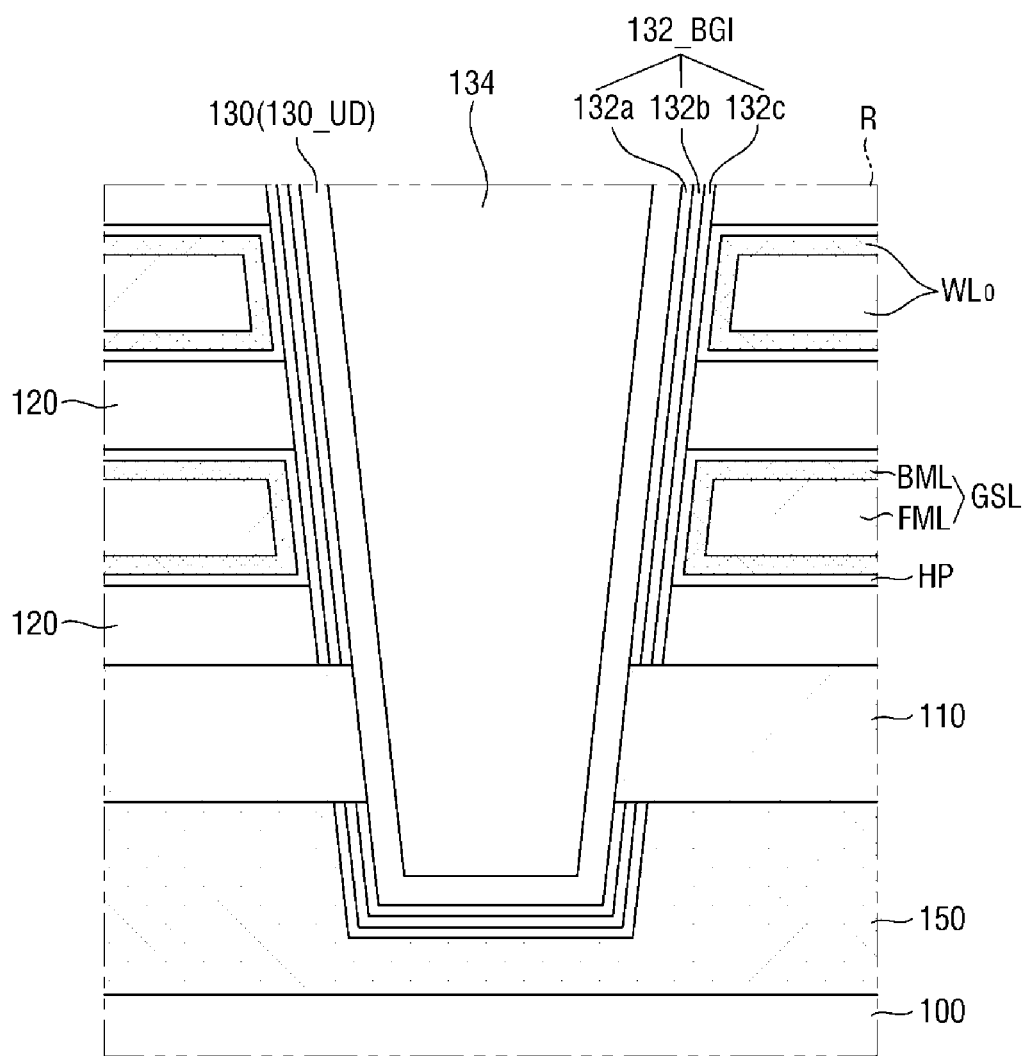
FIGS. 6A and 6B are respective, enlarged views of region 'R' of FIG. 3.
Figure 6B:
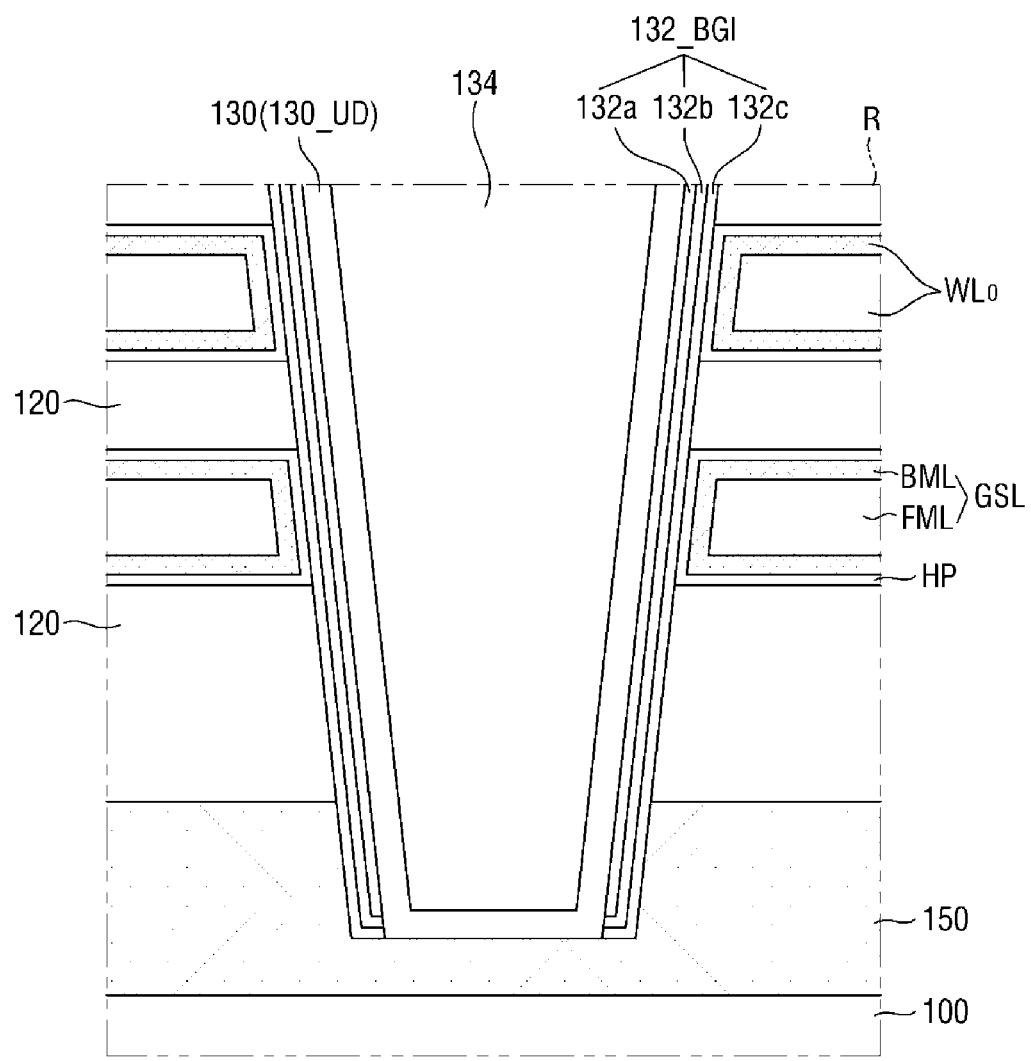

FIG. 2 is a layout diagram (i.e., a plan view or top-down view) illustrating a 3D, non-volatile memory device according to embodiments of the inventive concept. FIG. 3 is a cross-sectional view taken along a line A-A of FIG. 2. FIGS. 4A and 4B (as well as FIGS. 7A and 7B) are respective diagrams further illustrating alternatives for the region 'P' of FIG. 3; FIGS. 5A and 5B are respective diagrams further illustrating alternatives for the region 'Q' of FIG. 3; and FIGS. 6A and 6B are respective diagrams further illustrating alternatives for the region 'R' of FIG. 3.

Referring collectively to FIGS. 2, 3, 4A, 4B, 5A, 5B, 6A and 6B, the exemplary semiconductor memory device may include a substrate 100, a lower stacked structure BST, an upper stacked structure UST, vertical structures VS, one or more sub-cutting lines SLC and bit lines BL.

The substrate 100 may include at least one of a silicon substrate, a silicon germanium substrate, a germanium substrate, SGOI (silicon germanium on insulator), SOI (silicon-on-insulator), and GOI (Germanium-On-Insulator). Alternatively, the substrate 100 may include, but is not limited to, a semiconductor material such as indium antimonide, a lead telluride, indium arsenide, indium phosphide, gallium arsenide or gallium antimonide.

A horizontal conductive substrate 150 may be disposed on the substrate 100. The horizontal conductive substrate 150 may be a common source plate. That is, the horizontal conductive substrate 150 may serve as the common source line CSL of FIG. 1.

The horizontal conductive substrate 150 may include at least one of a conductive semiconductor film, a metal silicide film, and a metal film. If the horizontal conductive substrate 150 includes a conductive semiconductor film, the horizontal conductive substrate 150 may include, for example, at least one of silicon (Si), germanium (Ge), silicon germanium (SiGe), gallium arsenide (GaAs), indium gallium arsenic (InGaAs), aluminum gallium arsenide (AlGaAs) or a combination thereof. The horizontal conductive substrate 150 may have a crystal structure including at least one selected from single crystal, amorphous and polycrystal. The horizontal conductive substrate 150 may include at least one of P-type impurities, N-type impurities, and carbon contained in the semiconductor film.

The lower stacked structure BST may be disposed on the horizontal conductive substrate 150. The lower stacked structure BST may include lower metallic lines GSL, word lines $WL_0$ to $WL_n$ and DWL and inter-electrode insulation films 120 and 125 vertically stacked (e.g., in a third direction D3). The inter-electrode insulation films 120 and 125 are disposed between the lower metallic lines GSL, word lines $WL_0$ to $WL_n$ and DWL which are vertically spaced apart from each other.

The lower metallic lines GSL, word lines $WL_0$ to $WL_n$ and DWL may include a ground selection line GSL, word lines $WL_0$ to $WL_n$, and a dummy word line DWL. The ground selection line GSL, the word lines $WL_0$ to $WL_n$, and the dummy word line DWL may be sequentially stacked on the substrate 100.

Although only six word lines $WL_0$ to $WL_n$ are shown on the ground selection line GSL in FIG. 3, this is merely for convenience of description, and the inventive concept is not limited thereto. Further, although the lower metallic line disposed on an uppermost part of the lower stacked structure BST is shown as the dummy word line DWL, the inventive concept is not limited thereto. The lower metallic line disposed on the uppermost part of the lower stacked structure BST may, of course, be a word line $WL_n$.

The lower stacked structure BST may include a first sub-lower stacked structure BST_1, and a second sub-lower stacked structure BST_2 on the first sub-lower stacked structure BST_1. The first sub-lower stacked structure BST_1 may include a ground selection line GSL and some word lines $WL_0$ to $WL_k$. The second sub-lower stacked structure BST_2 may include remaining word lines $WL_{k+1}$ to $WL_n$ and the dummy word lines DWL. Here, n is a natural number larger than k.

The inter-electrode insulation film 125 between a word line $WL_k$ located at the uppermost part of the first sub-lower stacked structure BST_1 and a word line $WL_{k+1}$ located at the lowermost part of the second sub-lower stacked structure BST_2 is thicker than the thickness of the inter-electrode insulation film 120 in the first sub-lower stacked structure BST_1 and the second sub-lower stacked structure BST_2.

The upper stacked structure UST may be disposed on the lower stacked structure BST. The upper stacked structure UST may include a first upper metallic line SSL and a second upper metallic line EL stacked in the third direction D3. The first upper metallic line SSL may be closer to the substrate 100 than the second upper metallic line EL. The upper stacked structure UST may include an inter-electrode insulation film 120 between the first upper metallic line SSL and the second upper metallic line EL.

The first upper metallic line SSL may serve as a string selection line of FIG. 1, and the second upper metallic line EL may serve as an erasing control line of FIG. 1. The first upper metallic line SSL may be included in the string selection transistor SST of FIG. 1, and the second upper metallic line EL may be included in the erasing control transistor ET of FIG. 1.

An inter-structure insulation film 126 may be disposed between a lower surface of the first upper metallic line SSL and an upper surface of the dummy word line DWL. The inter-structure insulation film 126 may be thicker than a thickness of the inter-electrode insulation film 120 in the first sub-lower stacked structure BST_1 and the second sub-lower stacked structure BST_2.

In FIGS. 4A and 4B, the lower metallic lines GSL, word lines $WL_0$ to $WL_n$ and DWL, the first upper metallic line SSL and the second upper metallic line EL may include the same material. For example, the lower metallic lines GSL, word lines $WL_0$ to $WL_n$ and DWL, the first upper metallic line SSL and the second upper metallic line EL may have the same conductive film stacked structure. The lower metallic lines GSL, word lines $WL_0$ to $WL_n$ and DWL, the first upper metallic line SSL and the second upper metallic line EL may be formed at the same level. In this regard, the term "same level" denotes lines that are formed by the same fabricating process(es).

The lower metallic lines GSL, word lines $WL_0$ to $WL_n$ and DWL, the first upper metallic line SSL and the second upper metallic line EL may include a barrier conductive film BML and a filling conductive film FML, respectively. The filling conductive film FML is disposed on the vertical channel film 130. The barrier conductive film BML is disposed between the filling conductive film FML and the vertical channel film 130.

The barrier conductive film BML may include at least one of a metal, a metal nitride, a metal carbonitride, and a two-dimensional (2D) material. For example, the two-dimensional material may be metallic material and/or semiconductor material. The 2D material may include a 2D allotrope or a 2D compound. Although the filling conductive film FML may include a metal such as tungsten (W), cobalt (Co) and nickel (Ni), the type of metal is not limited thereto.

The inter-electrode insulation films 120 and 125, and the inter-structure insulation film 126 may include, for example, but is not limited to, silicon oxide.

A cutting line WLC may be disposed in the upper stacked structure UST and the lower stacked structure BST. The cutting line WLC may penetrate the upper stacked structure UST and the lower stacked structure BST. The cutting line WLC may extend in a second horizontal direction (e.g., a second direction D2) to cut the upper stacked structure UST and the lower stacked structure BST. Adjacent cutting lines WLC may be spaced apart from each other in a first horizontal direction (e.g., a first direction D1).

The cutting line WLC may cut the lower conductive lines GSL, word lines $WL_0$ to $WL_n$ and DWL, the first upper conductive line SSL and the second upper conductive line EL.

One or more sub-cutting line(s) SLC (hereafter, "sub-cutting lines SLC") may be disposed between the adjacent cutting lines WLC. That is, the more sub-cutting lines SLC may be disposed between the adjacent cutting lines WLC. For example, the sub-cutting lines SLC may be disposed between the adjacent cutting lines WLC.

The sub-cutting lines SLC may extend in the second direction D2. For example, the sub-cutting lines SLC may laterally extend in an alternating, or wave pattern.

The sub-cutting lines SLC are disposed in the upper stacked structure UST, but are not disposed in the lower stacked structure BST. That is, the sub-cutting lines SLC cut the first upper conductive line SSL and the second upper conductive line EL, but do not cut the lower conductive lines GSL, word lines $WL_0$ to $WL_n$ and DWL.

The sub-cutting line SLC may separate the first upper conductive line SSL and the second upper conductive line EL into two or more parts. If there are two or more sub-cutting lines SLC, the first upper conductive line SSL and the second upper conductive line EL may be separated into three or more parts by the sub-cutting line SLC. As shown in FIGS. 2 and 3, if there are three or more sub-cutting lines SLC, the first upper conductive line SSL may be separated into first_1 to first_4 sub-conductive lines SSL_S1, SSL_S2, SSL_S3 and SSL_S4, and the second upper conductive line EL may be separated into second_1 to second_4 conductive lines EL_S1, EL_S2, EL_S3 and EL_S4.

The sub-cutting lines SLC and the cutting line WLC may each include an insulating material. The sub-cutting lines SLC and the cutting line WLC may include, for example, at least one of silicon oxide, silicon nitride, silicon oxynitride, and a low dielectric constant material. The low-dielectric constant material may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

Alternately, each of the sub-cutting lines SLC and the cutting line WLC may include one or more films.

In FIGS. 5A and 5B, the barrier conductive film BML does not extend along a boundary between a sub-cutting line SLC and the filling conductive film FML. If the sub-cutting line SLC is formed after forming the first upper metallic line SSL and the second upper metallic line EL, such a shape of the barrier conductive film BML may appear.

As an example, in FIG. 5A, the sub-cutting line SLC does not indent between the first upper metallic line SSL and the second upper metallic line EL adjacent to each other in the third direction D3. As another example, in FIG. 5B, a part of the sub-cutting line SLC protrudes in the first direction D1 and may indent between the upper metallic line SSL and the second upper metallic line EL adjacent to each other in the third direction D3.

The vertical structure VS extends in the third direction D3. The vertical structure VS may penetrate the upper stacked structure UST and the lower stacked structure BST. The vertical structure VS may include an upper vertical structure VS_U disposed in the upper stacked structure UST, and a lower vertical structure VS_B disposed in the lower stacked structure BST.

In FIG. 2, the size of the upper vertical structure VS_U may be less than a size of the lower vertical structure VS_B. That is, a width of the upper vertical structure VS_U in the first direction D1 may be less than a width of the lower vertical structure VS_B in the first direction D1. A width of the upper vertical structure VS_U in the second direction D2 may be less than a width of the lower vertical structure VS_B in the second direction D2.

For example, the center of the upper vertical structure VS_U may not coincide (or align) with the center of the lower vertical structure VS_B. When a center line CEN_L extending in the second direction D2 is defined between the adjacent sub-cutting lines SLC, the center of the upper vertical structure VS_U may be closer to the center line CEN_L than the center of the lower vertical structure VS_B.

The bit line pad BL_PAD may be disposed on the vertical structure VS. The bit line pad BL_PAD may include a conductive material (e.g., a semiconductor material doped with N-type impurities).

In semiconductor memory devices according to embodiments of the inventive concept, the vertical structure VS may include width extension regions W_EXR1 and W_EXR2 in which a width in the first direction D1 increases as it extends away from the bit line pad BL_PAD.

The first width extension region W_EXR1 may be defined between the upper stacked structure UST and the lower stacked structure BST. For example, the first width extension region W_EXR1 may be defined between the lower surface of the first upper metallic line SSL and the upper surface of the dummy word line DWL.

The second width extension region W_EXR2 may be defined in the lower stacked structure BST. The second width extension region W_EXR2 may be defined between the first sub-lower stacked structure BST_1 and the second sub-lower stacked structure BST_2.

In the first width extension region W_EXR1, a width W1 of the upper vertical structure VS_U in the first direction D1 may be less than a width W21 of the lower vertical structure VS_B in the first direction D1.

Although two width extension regions W_EXR1 and W_EXR2 are shown in FIG. 3, the inventive concept is not limited thereto. If the lower stacked structure BST includes three or more sub-lower stacked structures, the width extension region may increase depending on the number of sub-lower stacked structures.

As it extends away from the bit line pad BL_PAD, the width of the lower vertical structure VS_B in the second sub-lower stacked structure BST_2 in the first direction D1 decreases from W21 to W22. In the second width extension region W_EXR2, the width of the lower vertical structure VS_B in the first direction D1 increases from W22 to W3. Thereafter, as it extends away from the bit line pad BL_PAD, the width of the lower vertical structure VS_B in the first sub-lower stacked structure BST_1 in the first direction D1 may gradually decrease.

The vertical structure VS may include a vertical channel film 130 extending in the third direction D3, and a vertical insulation pattern 134 which fills a space defined by the vertical channel film 130. The vertical channel film 130 may be electrically connected to the horizontal conductive substrate 150 that serves as a common source line. The vertical channel film 130 may be in contact with the bit line pad BL_PAD. The vertical channel film 130 may include sidewall parts extending in the third direction D3, and a bottom part that connects the sidewall parts of the vertical channel film 130. The sidewall parts of the vertical structure VS may have a pipe shape having a hollow space inside, for example, a cylindrical shape or a macaroni shape.

The vertical channel film 130 may include an upper vertical channel film 130_UCL disposed in the upper vertical structure VS_U, and a lower vertical channel film 130_BCL disposed in the lower vertical structure VS_B.

In FIGS. 4A and 4B, the vertical channel film 130 may include a doping channel region 130_DO doped with N-type impurities, and an undoped channel region 130_UD. The doping channel region 130_DO may be in contact with the bit line pad BL_PAD.

The upper vertical channel film 130_UCL includes the doped doping channel region 130_DO, and a part of the undoped channel region 130_UD. The lower vertical channel film 130_BCL includes the undoped channel region 130_UD, and does not include the doped doping channel region 130_DO.

For example, the doping channel region 130_DO may be an N+ impurity region. Here, the term "undoped channel region" does not mean a channel region including no impurities. Instead, the term "undoped channel region" means a channel region wherein no impurities have been intentionally doped. For example, the undoped channel region 130_UD may at least partially include some N-type impurities that diffuse from the doping channel region 130_DO. Alternatively, the undoped channel region 130_UD may include impurities that are unintentionally introduced from a process chamber, or the like, during a fabricating process of forming the vertical channel film 130.

In the semiconductor memory device according to embodiments of the inventive concept, the doping channel region 130_DO may overlap a part of the second upper metallic line EL in the first direction D1. However, the doping channel region 130 does not overlap the first upper metallic line SSL located at the lowermost part of the upper stacked structure UST in the first direction D1.

That is, a first height H11 from the lower surface of the first upper metallic line SSL to the lower surface of the second upper metallic line EL may be less than a second height H12 from the lower surface of the first upper metallic line SSL to the doping channel region 130_DO.

Referring to FIG. 1, at the time of the erasing operation, a first voltage which is an erasing voltage may be applied to the bit line BL, and a small second voltage less than the first voltage may be applied to the second upper metallic line EL. Due to a voltage difference between the bit line pad BL_PAD and the second upper metallic line EL, a gate-induced drain leakage (GIDL) may occur in the erasing control transistor including the second upper metallic line EL. In the semiconductor memory device according to embodiments of the inventive concept, a gate-induced drain leakage (GIDL) phenomenon may be easily guided, by placing the doping channel region 130_DO to horizontally overlap a part of the second upper metallic line EL. Due to the GIDL phenomenon, electron-hole pairs may be generated at a portion in which the doping channel region 130_DO and the second upper metallic line EL overlap each other. At this time, the electrons are pulled toward the bit line pad BL_PAD, and the holes may be smoothly provided into the charge storage film 132b. Accordingly, the erasing operation of the semiconductor memory device may be successfully performed.

In FIGS. 4A and 4B, the undoped channel region 130_UD may include an upper vertical extension region 130_UV1 and a lower vertical extension region 130_BV1 extending in the third direction D3. The undoped channel region 130_UD may include a horizontal extension region 130_HC which connects the upper vertical extension region 130_UV1 and the lower vertical extension region 130_BV1. The horizontal extension region 130_HC may extend in the first direction D1.

The upper vertical extension region 130_UV1 may be included in the upper vertical channel film 130_UCL. The upper vertical extension region 130_UV1 is directly connected to the doping channel region 130_DO. The lower vertical extension region 130_BV1 and the horizontal extension region 130_HC may be included in the lower vertical channel film 130_BCL.

The horizontal extension region 130_HC may include a first horizontal extension region 130_HC1 and a second horizontal extension region 130_HC2. The first horizontal extension region 130_HC1 and the second horizontal extension region 130_HC2 may be spaced apart from each other in the third direction D3.

Between the lower surface of the dummy word line DWL located at the uppermost part of the lower stacked structure BST and the lower surface of the first upper metallic line SSL, the first horizontal extension region 130_HC1 may directly connects the upper vertical extension region 130_UV1 and the lower vertical extension region 130_BV1.

The second horizontal extension region 130_HC2 is directly connected to the lower vertical extension region 130_BV1, but is not directly connected to the upper vertical extension region 130_UV1.

That is, the vertical channel film 130 includes a first horizontal extension region 130_HC1 that bends in the first direction D1 below the lower surface of the first upper metallic line SSL.

In like manner, the vertical channel film 130 may include a horizontal extension region that bends in the first direction D1 between the first sub-lower stacked structure BST_1 and the second sub-lower stacked structure BST_2.

The first width extension region W_EXR1 may be defined at the position where the horizontal extension region 130_HC is formed. Similarly, a horizontal extension region is formed in the second width extension region W_EXR2.

The horizontal extension region 130_HC may separate the vertical insulation pattern 134 into two parts. More specifically, the first horizontal extension region 130_HC1 may not separate the vertical insulation pattern 134 into two parts. However, the second horizontal extension region 130_HC2 may separate the vertical insulation pattern 134 into two parts.

In FIG. 4A, an air gap may not be formed in the vertical insulation pattern 134. Meanwhile, in FIG. 4B, an air gap AG may be formed in the vertical insulation pattern 134.

The vertical channel film 130 may include a semiconductor material such as silicon (Si), germanium (Ge) or a combination thereof. Alternatively, the vertical channel film 130 may include a semiconductor material such as a metal oxide semiconductor material, an organic semiconductor material, and a carbon nanostructure. In the semiconductor memory device according to some embodiments, the vertical channel film 130 may include polycrystalline silicon.

The vertical insulation pattern 134 may include, for example, but is not limited to, one or more of silicon oxide, silicon oxynitride, and a low dielectric constant material.

The vertical structure VS may include an upper channel insulation film 132_UGI disposed between the upper vertical channel film 130_UCL and the first upper metallic line SSL, between the upper vertical channel film 130_UCL and the second upper metallic line EL, and between the upper vertical channel film 130_UCL and the inter-electrode insulation film 120. The vertical structure VS may include a lower channel insulation film 132_BGI disposed between the lower vertical channel film 130_BCL and the lower metallic lines GSL, word lines $WL_0$ to $WL_n$ and DWL, and between the lower vertical channel film 130_BCL and the inter-electrode insulation film 120. The upper channel insulation film 132_UGI and the lower channel insulation film 132_BGI may extend along the upper vertical channel film 130_UCL and the lower vertical channel film 130_BCL.

In FIGS. 4A, 4B, 6A and 6B, the lower channel insulation film 132_BGI may include, for example, a tunnel insulation film 132a, a charge storage film 132b, and a blocking insulation film 132c sequentially disposed on the vertical channel film 130. The tunnel insulation film 132a, the charge storage film 132b and the blocking insulation film 132c are merely examples, but are not limited thereto.

The tunnel insulation film 132a may include, for example, silicon oxide or a high dielectric constant material (e.g., aluminum oxide ($Al_2O_3$) or hafnium oxide ($HfO_2$)). The charge storage film 132b may include, for example, silicon nitride. The blocking insulation film 132c may include, for example, silicon oxide or a high dielectric constant material (e.g., aluminum oxide ($Al_2O_3$) or hafnium oxide ($HfO_2$)). In the semiconductor memory device according to some embodiments, the tunnel insulation film 132a and the blocking insulation film 132c may include silicon oxide.

A horizontal insulation pattern HP may be disposed between the lower metallic lines GSL, word lines $WL_0$ to $WL_n$ and DWL and the lower channel insulation film 132_BGI. The horizontal insulation pattern HP may include, for example, silicon oxide or a high dielectric constant material (e.g., aluminum oxide ($Al_2O_3$) or hafnium oxide ($HfO_2$)). Unlike the shown case, the horizontal insulation pattern HP may not be disposed between the lower metallic lines GSL, word lines $WL_0$ to $WL_n$ and DWL and the lower channel insulation film 132_BGI.

In FIG. 6A, the tunnel insulation film 132a, the charge storage film 132b and the blocking insulation film 132c may be separated from the lower part of the vertical channel film 130. The separated tunnel insulation film 132a, charge storage film 132b and blocking insulation film 132c may expose a part of the vertical channel film 130. The vertical structure support film 110 may be disposed between the separated tunnel insulation film 132a, charge storage film 132b and blocking insulation film 132c. The vertical structure support film 110 may electrically connect the horizontal conductive substrate 150 and the vertical channel film 130. The vertical structure support film 110 may include, for example, a semiconductor material such as silicon (Si), germanium (Ge) or a mixture thereof.

In FIG. 6B, the vertical structure support film 110 may not be disposed between the horizontal conductive substrate 150 and the lower stacked structure BST. In such a case, the sidewall parts of the vertical channel film 130 may not be exposed, but the bottom part of the vertical channel film 130 may be exposed. The tunnel insulation film 132a, the charge storage film 132b and the blocking insulation film 132c between the bottom part of the vertical channel film 130 and the horizontal conductive substrate 150 may be removed. The vertical channel film 130 may be electrically connected to the horizontal conductive substrate 150 through the bottom part of the vertical channel film 130.

In FIGS. 4A and 4B, unlike the lower channel insulation film 132_BGI, the upper channel insulation film 132_UGI may include, for example, silicon oxide. In the semiconductor memory device according to some embodiments, the stacked structure of the upper channel insulation film 132_UGI may be different from the structure of the lower channel insulation film 132_BGI.

Also, the lower channel insulation film 132_BGI may not be directly connected to the upper channel insulation film 132_UGI.

The first to third interlayer insulation films 121, 122 and 123 may be sequentially disposed on the upper stacked structure UST. A bit line pad BL_PAD may be disposed in the first interlayer insulation film 121. The cutting line WLC may penetrate the first interlayer insulation film 121 and the second interlayer insulation film 122. The first to third interlayer insulation films 121, 122 and 123 may each include, for example, but are not limited to, at least one of silicon oxide, silicon oxynitride, and a low dielectric constant material.

The bit line BL may be disposed on the upper stacked structure UST. The bit line BL may extend in the first direction D1. The bit line BL may be electrically connected to at least one of the vertical channel films 130. The bit line BL may be formed on the third interlayer insulation film 123. The bit line BL may be electrically connected to the bit line pad BL_PAD via a bit line plug BLPG. The bit line BL and the bit line plug BLPG each include a conductive material.

Figure 7A:
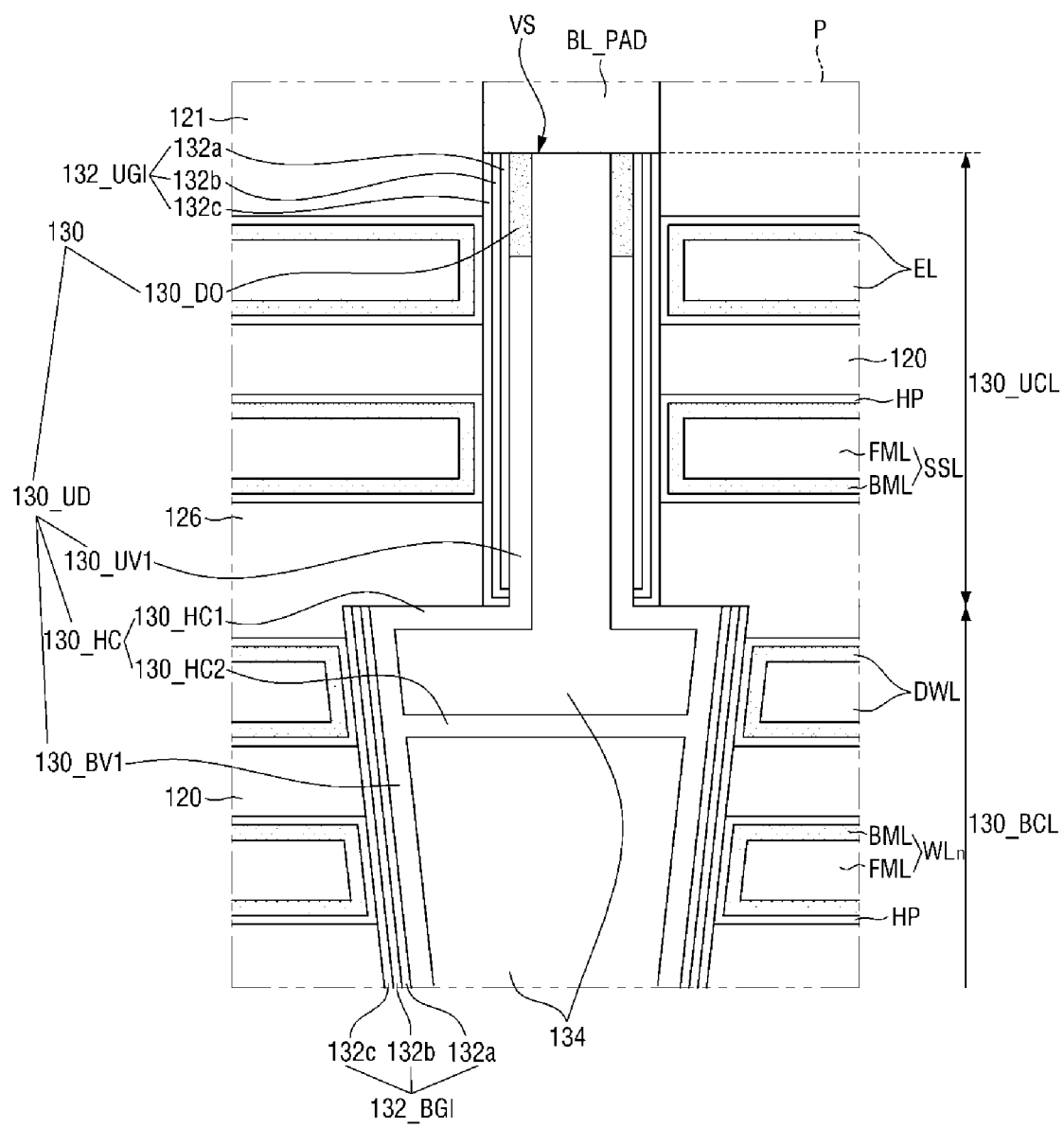
Figure 7B:
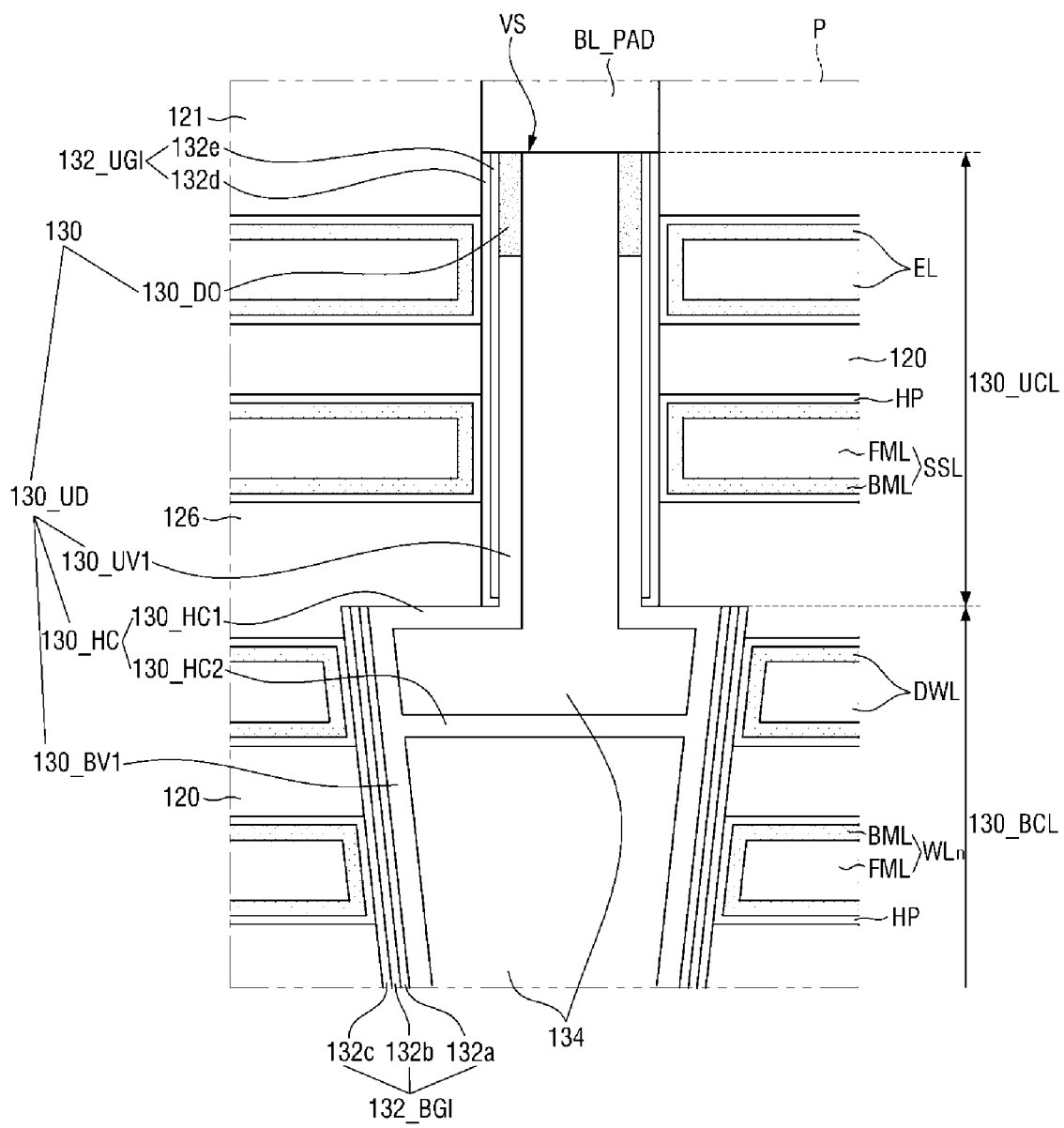

FIGS. 7A and 7B may be compared with FIGS. 4A and 4B.

Referring to the foregoing and FIG. 7A, in certain semiconductor memory devices according to embodiments of the inventive concept, the stacked structure of the upper channel insulation film 132_UGI may be the same as the structure of the lower channel insulation film 132_BGI.

That is, the upper channel insulation film 132_UGI may include a tunnel insulation film 132a, a charge storage film 132b, and a blocking insulation film 132c, which are sequentially disposed on the upper vertical channel film 130_UCL.

Referring to FIG. 7B, in certain semiconductor memory devices according to embodiments of the inventive concept, the upper channel insulation film 132_UGI may include an interface insulation film 132e and a high dielectric constant insulation film 132d sequentially disposed on the upper vertical channel film 130_UCL.

The interface insulation film 132e may be disposed between the high dielectric constant insulation film 132d and the upper vertical channel film 130_UCL.

The interface insulation film 132e may include, for example, silicon oxide. The high dielectric constant insulation film 132d may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Figure 8:
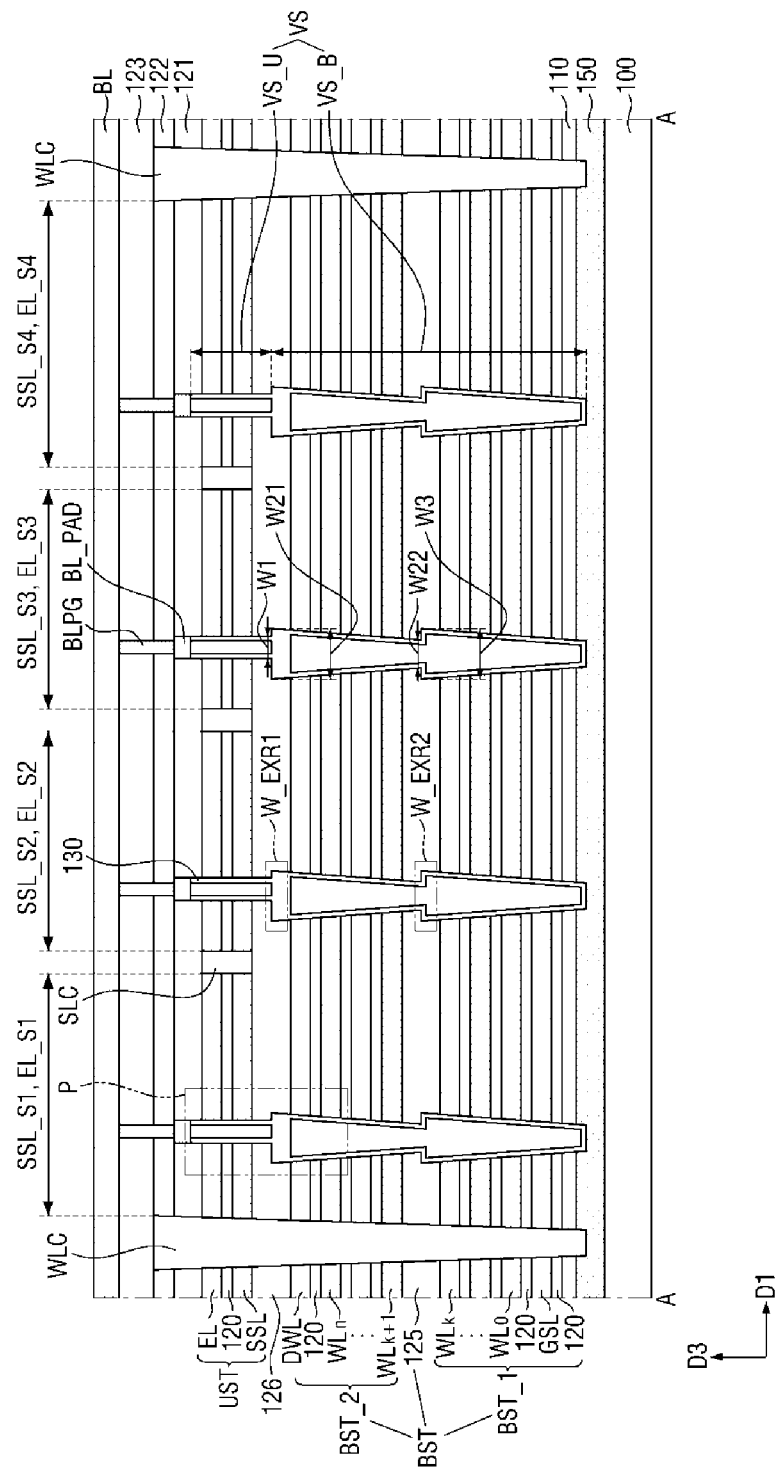
FIGS. 8 and 9 (as well as FIGS. 10 and 11, and FIGS. 15 and 16) are related cross-sectional diagrams illustrating semiconductor memory devices according to embodiments of the inventive concept.
Figure 9:
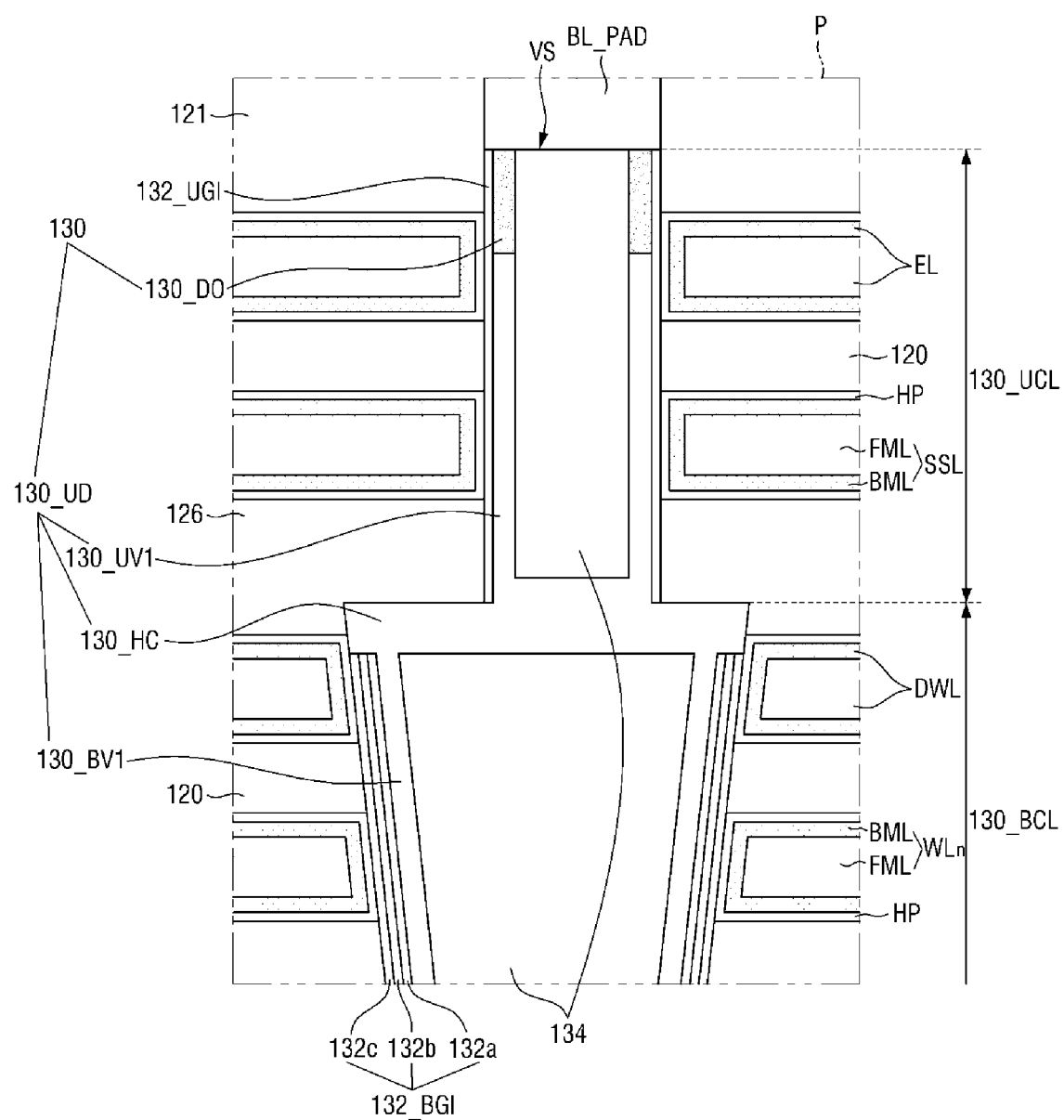

FIGS. 8 and 9 (as well as FIGS. 10 and 11) are cross-sectional diagrams illustrating semiconductor memory devices according to embodiments of the inventive concept. For convenience of description, differences between these embodiments and those described in relation to FIGS. 2, 3, 4A, 4B, 5A, 5B, 6A and 6B will be highlighted. Here, FIG. 9 (FIG. 11) is an enlarged view further illustrating the region 'P' of FIG. 8 (FIG. 10).

Referring to FIGS. 8 and 9, the upper vertical extension region 130_UV1 and the lower vertical extension region 130_BV1 may be directly connected to each other by the horizontal extension region 130_HC that separates the vertical insulation pattern 134 into two parts. Here, the horizontal extension region 130_HC may cover the upper surface of the lower channel insulation film 132_BGI.

Figure 10:
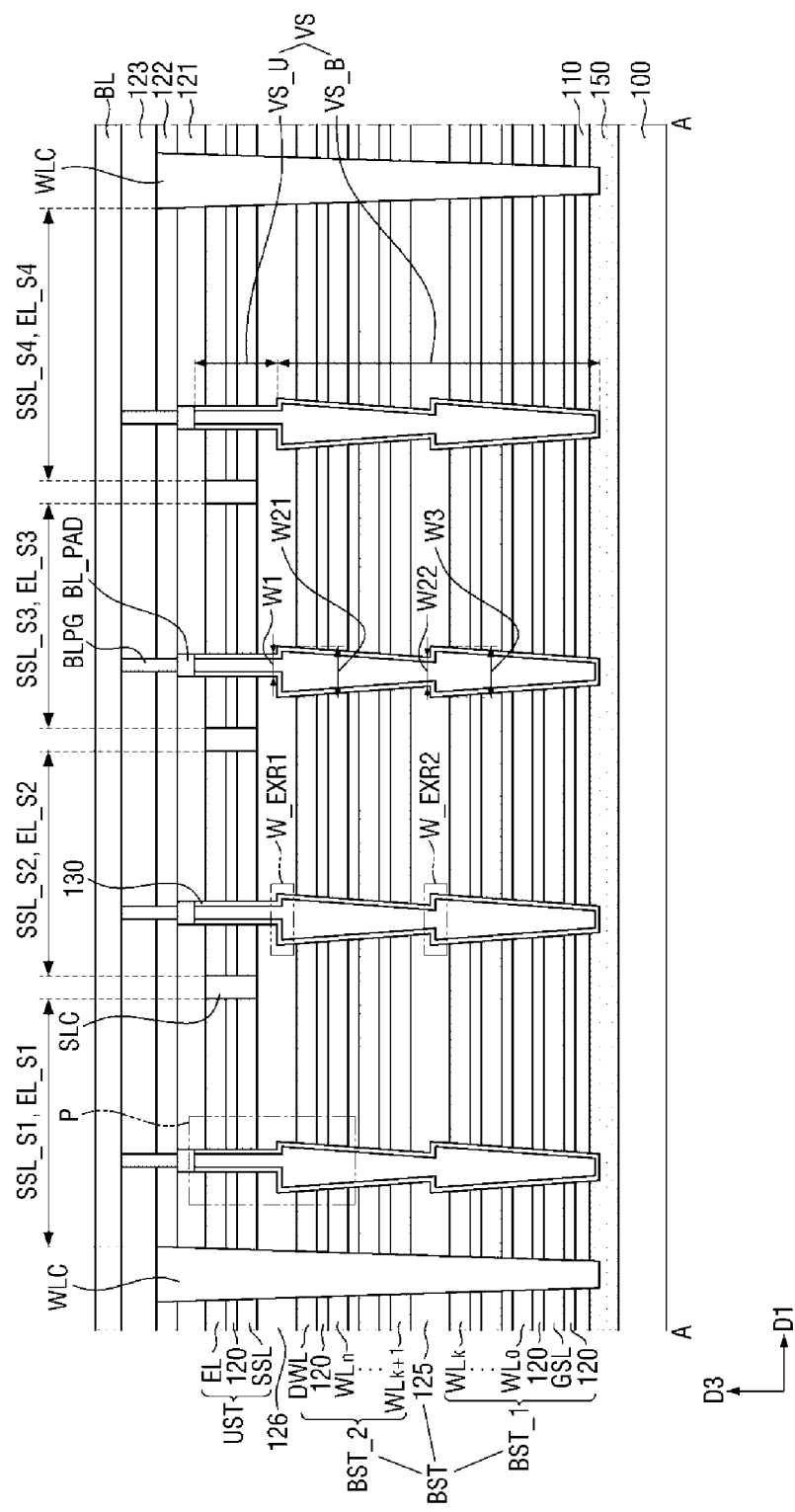
Figure 11:
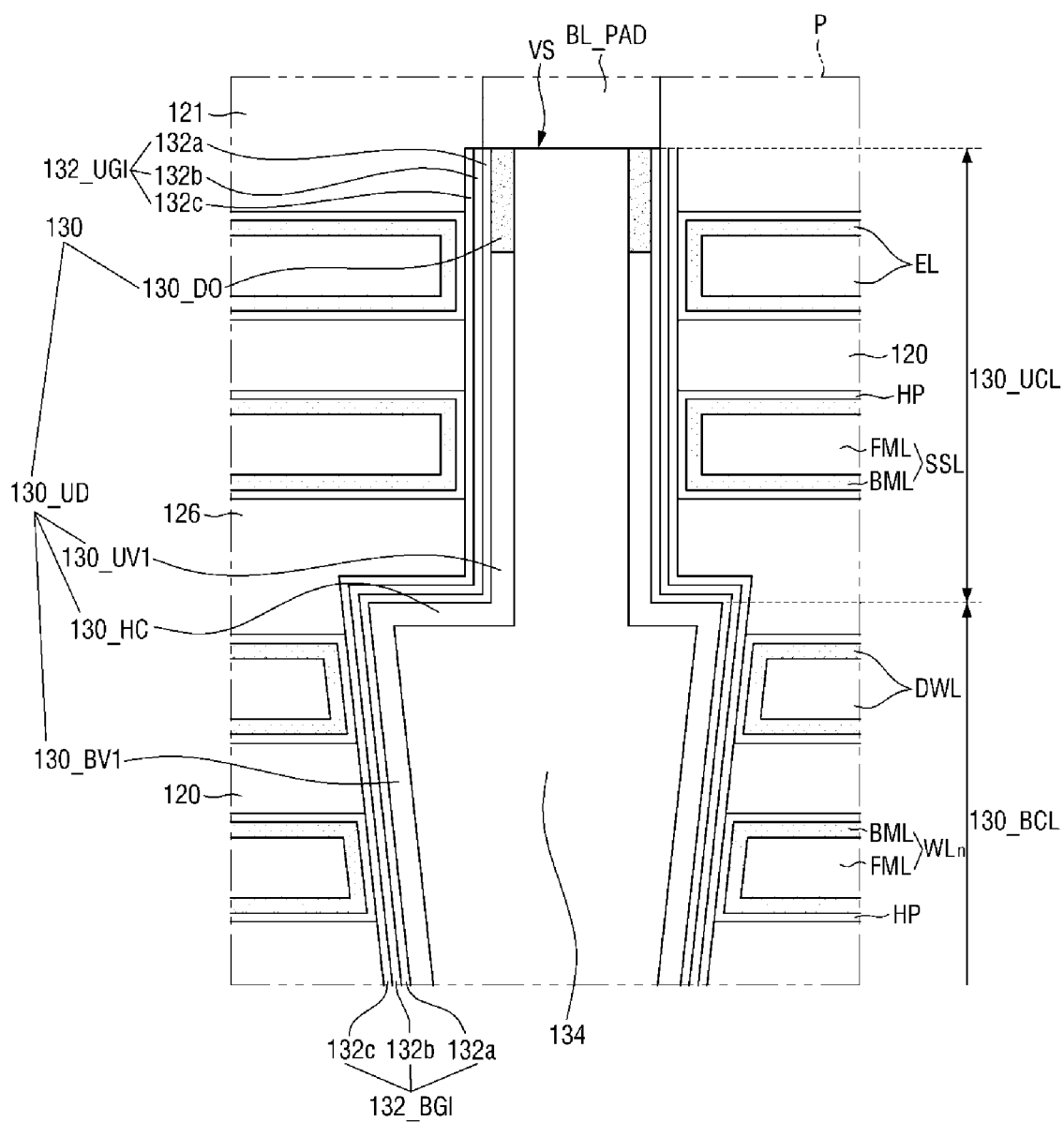

Referring to FIGS. 10 and 11, the vertical insulation pattern 134 may not be divided into two parts by the horizontal extension region 130_HC. And the stacked structure of the upper channel insulation film 132_UGI may be the same as the structure of the lower channel insulation film 132_BGI. Here, since the upper channel insulation film 132_UGI and the lower channel insulation film 132_BGI are continuously formed along the profile of the vertical channel film 130, the upper channel insulation film 132_UGI and the lower channel insulation film 132_BGI are directly connected to each other.

Figure 12:
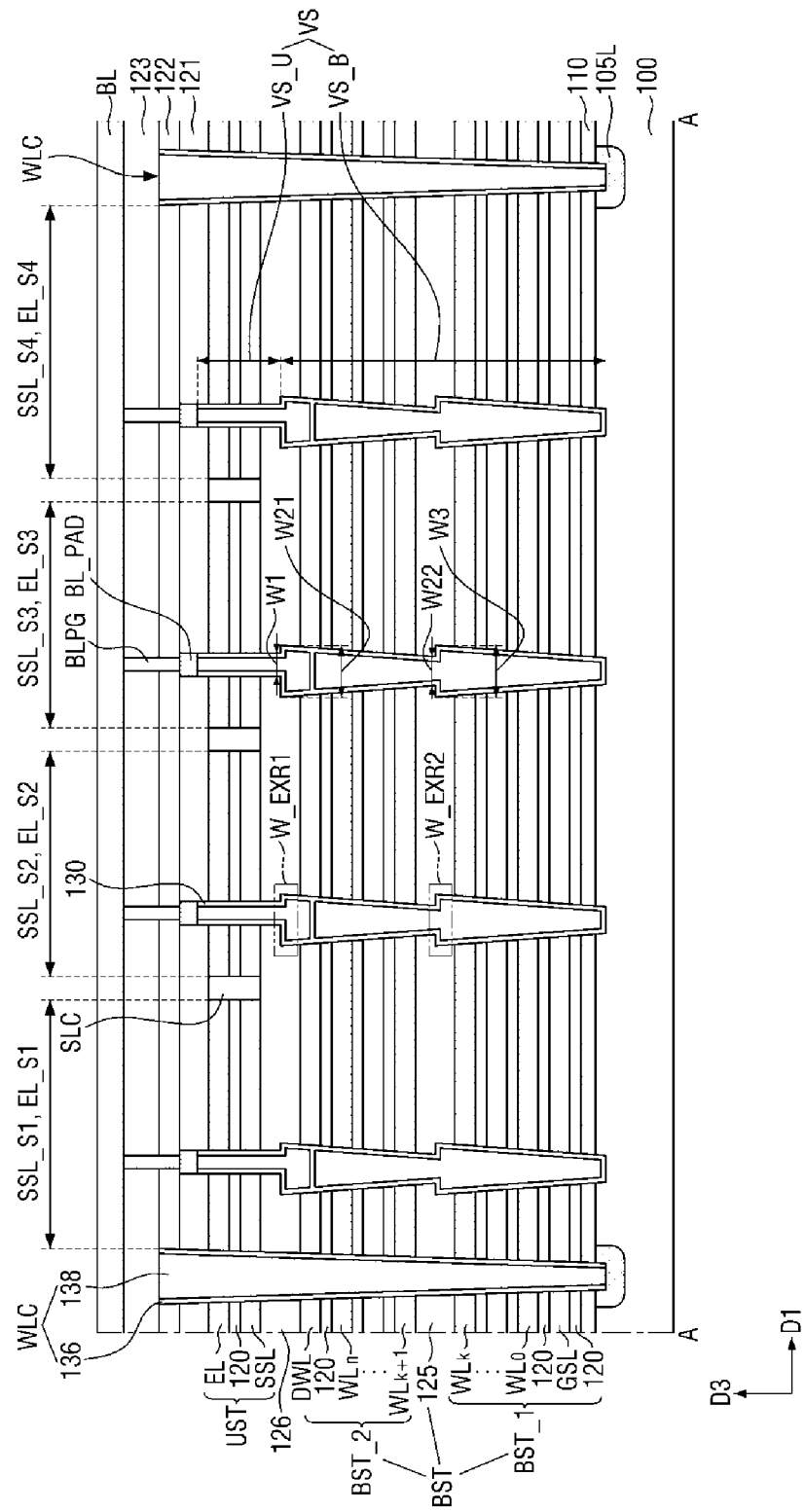
FIGS. 12, 13, 14 and 19 are respective, cross-sectional diagrams illustrating semiconductor memory devices according to embodiments of the inventive concept.
Figure 13:
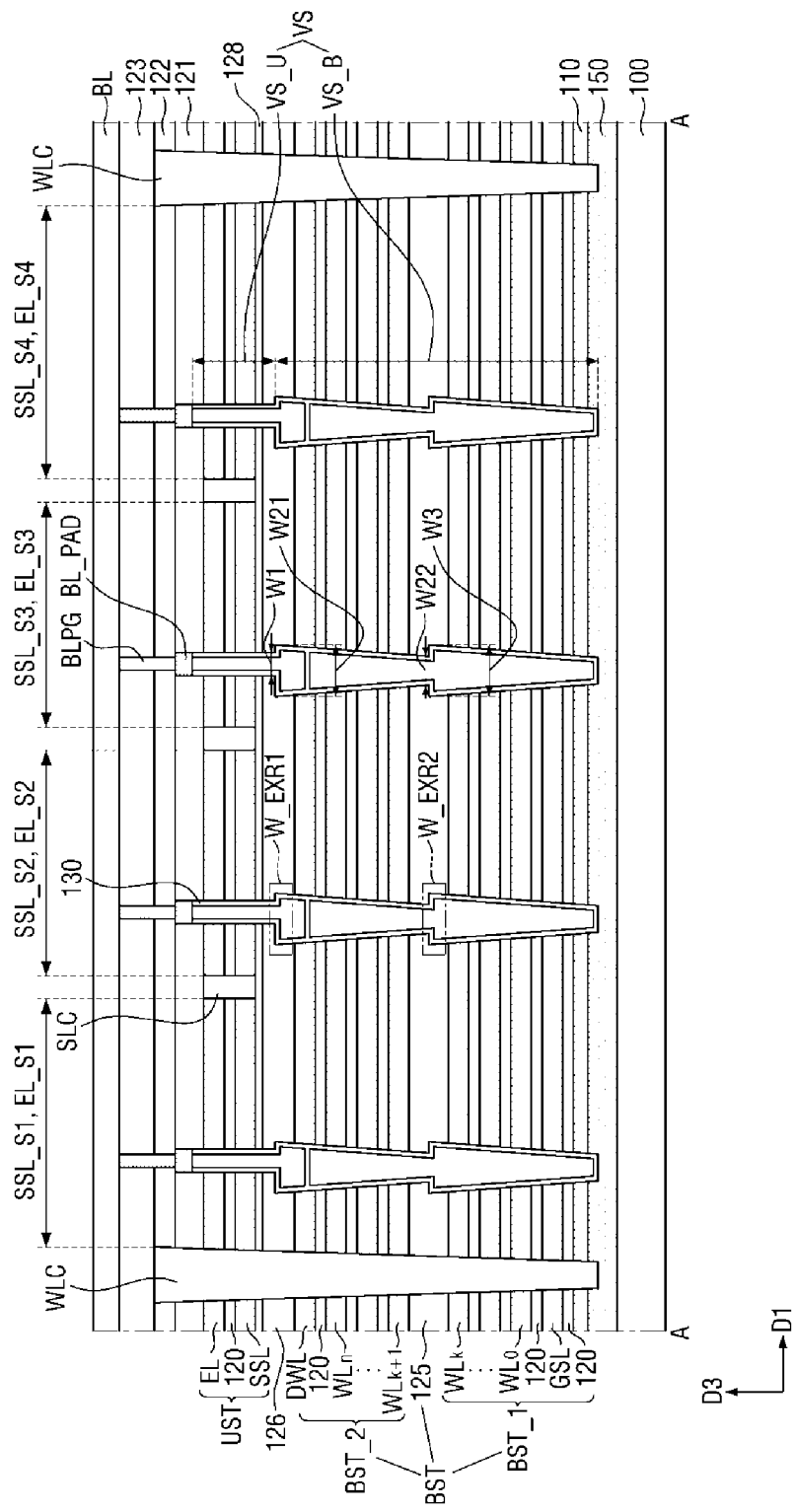
Figure 14:
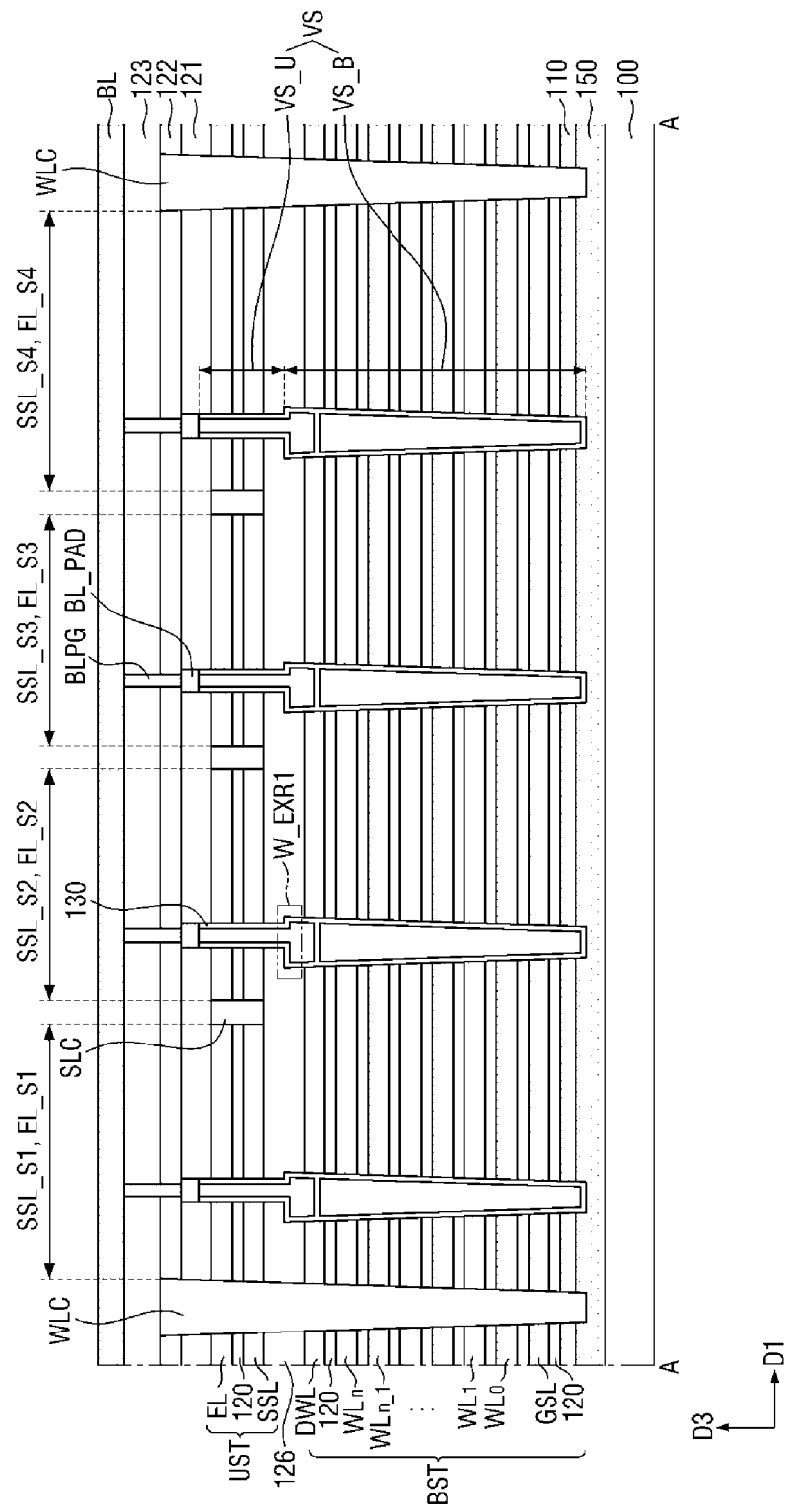

FIGS. 12, 13 and 14 are respective diagrams illustrating various semiconductor memory devices according to embodiments of the inventive concept. Here again for convenience of description, differences between these embodiments and those described in relation to FIGS. 2, 3, 4A, 4B, 5A, 5B, 6A and 6B will be highlighted.

Referring to FIG. 12, the cutting line WLC may include a plug pattern 138 and a spacer 136.

The plug pattern 138 penetrates the upper stacked structure UST and the lower stacked structure BST and may be connected to the substrate 100. In some embodiments, the plug pattern 138 may be provided on the common source line CSL of the semiconductor memory device of FIG. 1. For example, the plug pattern 138 may include a conductive material. Further, the plug pattern 138 may be connected to an impurity region 105L in the substrate 100. The impurity region 105L may extend, for example, in the second direction Y.

The spacer 136 may be interposed between the plug pattern 138 and the upper stacked structure UST, and between the plug pattern 138 and the lower stacked structure BST. For example, the spacer 136 may extend along the side surface of the plug pattern 138. The spacer 136 may include an insulating material. As a result, the plug pattern 138 may be electrically spaced apart from the lower metallic lines GSL, word lines $WL_0$ to $WL_n$, and DWL of the upper stacked structure UST and the lower stacked structure BST, the first upper metallic line SSL and the second upper metallic line EL.

Referring to FIG. 13, certain semiconductor memory devices according to embodiments of the inventive concept may further include a cutting prevention film 128.

The cutting prevention film 128 may extend along the lower surface of the first upper metallic line SSL.

The cutting prevention film 128 may prevent the lower metallic lines GSL, word lines $WL_0$ to $WL_n$, and DWL from being cut in the process of forming the sub-cutting line SLC.

Although the cutting prevention film 128 is shown as not being cut in the portion which it overlaps the sub-cutting line SLC in the first direction D1, the inventive concept is not limited thereto. That is, the cutting prevention film 128 may be cut in the process of forming the sub-cutting line SLC.

Referring to FIG. 14, the lower vertical structure VS_B may not include a width extension region in which a width extends in the first direction D1 within the lower stacked structure BST. Instead, the width of the lower vertical structure VS_B in the first direction D1 may be gradually reduced as the lower vertical structure VS_B extends away from the bit line pad BL_PAD. The vertical structure VS may include only a first width extension region W_EXR1 defined between the upper stacked structure UST and the lower stacked structure BST.

Figure 15:
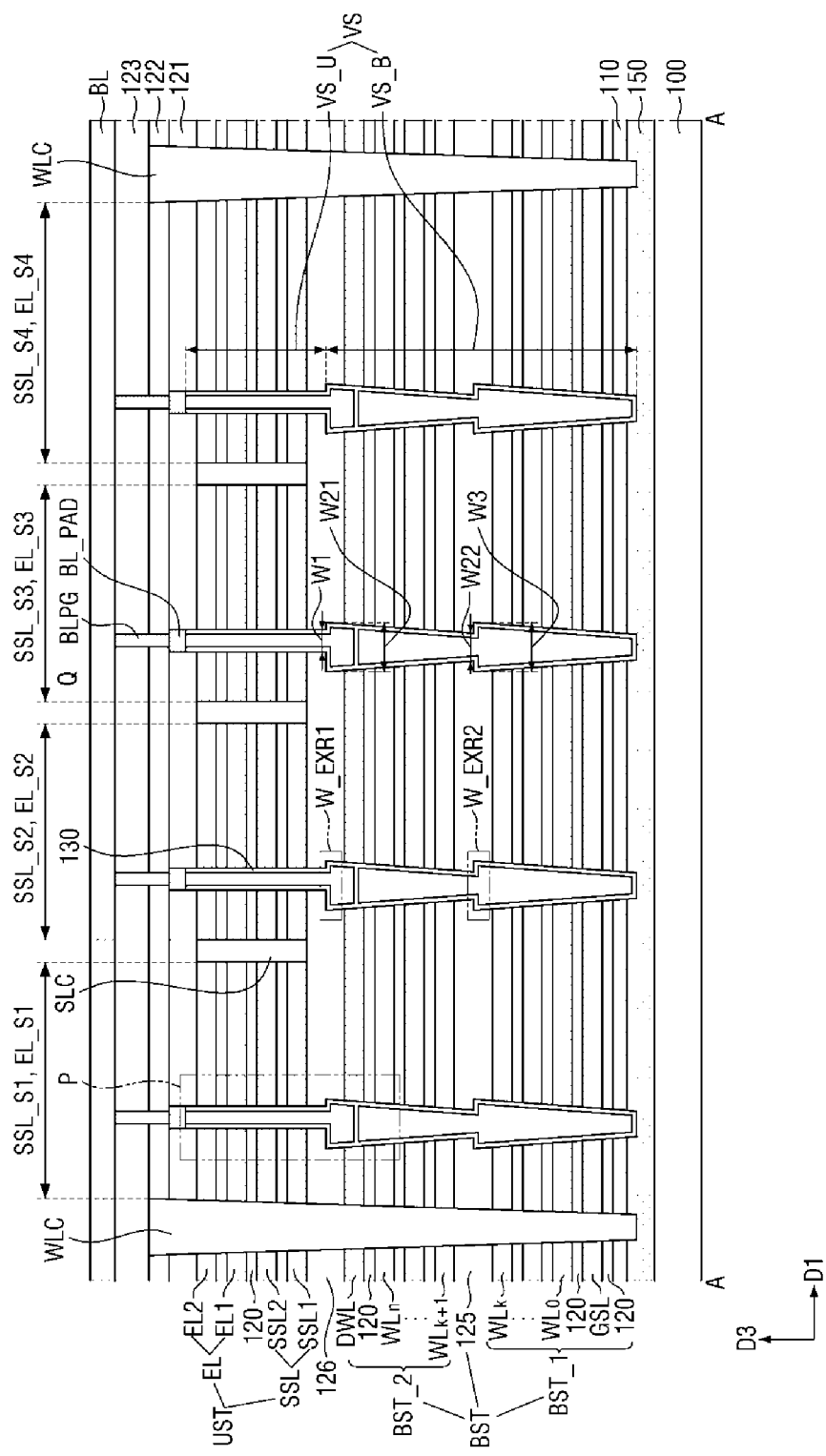
Figure 16:
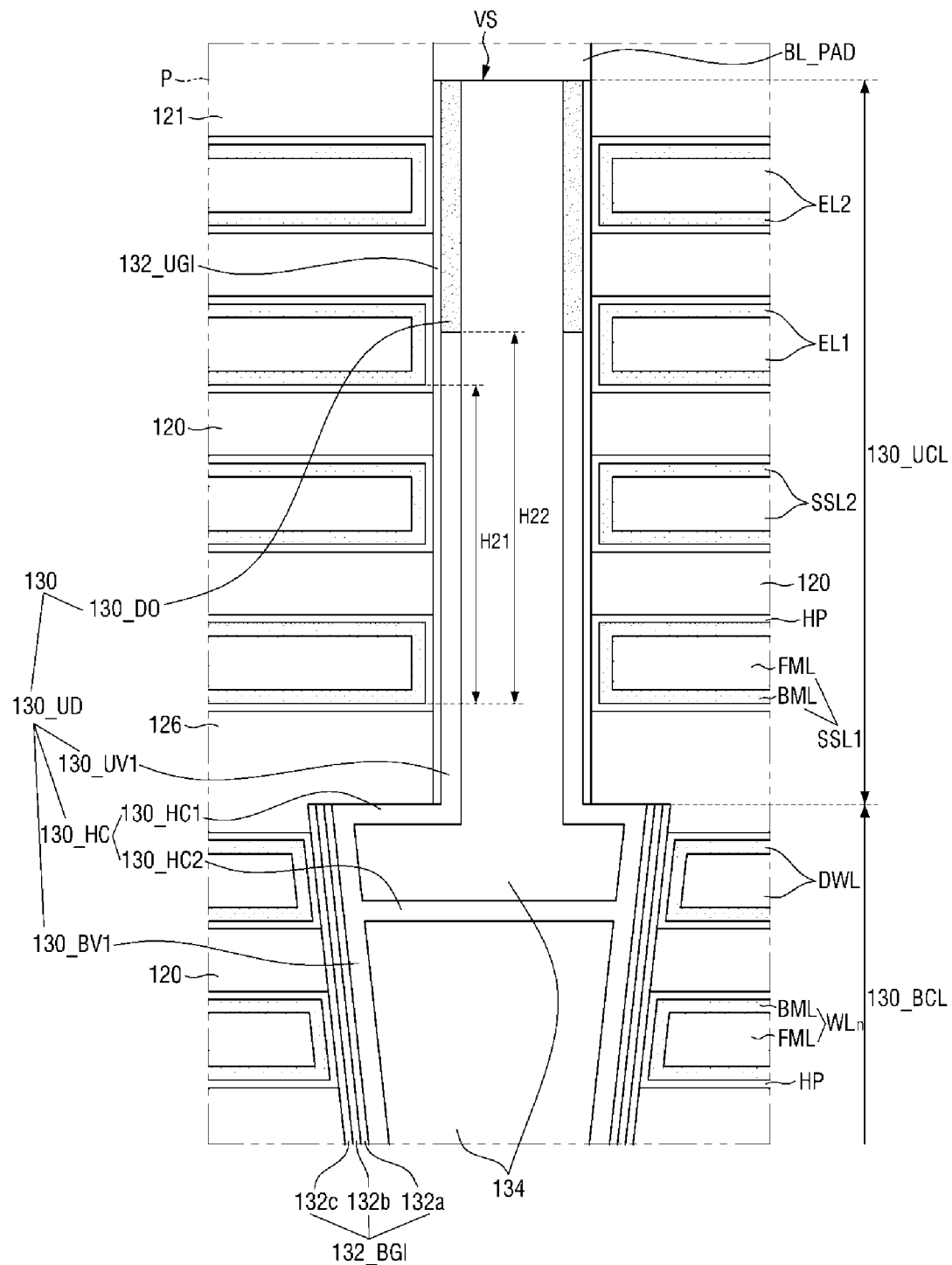

FIGS. 15 and 16 are cross-sectional diagrams illustrating semiconductor memory devices according to embodiments of the inventive concept. Again, for convenience of description, differences between these embodiments and those described in relation to FIGS. 2, 3, 4A, 4B, 5A, 5B, 6A and 6B will be highlighted. Here, FIG. 16 is an enlarged view further illustrating the region of FIG. 15.

Referring to FIGS. 15 and 16, the first upper metallic line SSL may include a first_1 upper metallic line SSL1 and a first_2 upper metallic line SSL2 sequentially stacked in the third direction D3.

The first_1 upper metallic line SSL1 and the first_2 upper metallic line SSL2 may be spaced apart from each other in the third direction D3. The first_2 upper metallic line SSL2 is closer to the bit line pad BL_PAD than the first_1 upper metallic line SSL1.

The first_1 upper metallic line SSL1 and the first_2 upper metallic line SSL2 serve as the string selection lines of FIG. 1 and may be included in the string selection transistor SST.

The second upper metallic line EL may include a second_1 upper metallic line EL1 and a second_2 upper metallic line EL2 sequentially stacked in the third direction D3.

The second_1 upper metallic line EL1 and the second_2 upper metallic line EL2 may be spaced apart from each other in the third direction D3. The second_2 upper metallic line EL2 is closer to the bit line pad BL_PAD than the second_1 upper metallic line EL1.

The second_1 upper metallic line EL1 and the second_2 upper metallic line EL2 serve as the erasing control lines of FIG. 1, and may be included in the erasing control transistor SST.

A third height H21 from a lower surface of the first_1 upper metallic line SSL1 to a lower surface of the second_1 upper metallic line EL1 may be less than a second height H22 from the lower surface of the first_1 upper metallic line SSL_1 to the doping channel region 130_DO.

That is, the doping channel region 130_DO may overlap a part of the second upper metallic line EL in the first direction D1.

Although the doping channel region 130_DO is shown to overlap the entire second_2 upper metallic line EL2 in the first direction D1 and overlap a part of the second_2 upper metallic line EL1 in the first direction D1, the inventive concept is not limited thereto.

Alternately, the doping channel region 130_DO may overlap the entire second_2 upper metallic line EL2 in the first direction D1 and may not overlap the second_1 upper metallic line EL1 in the first direction D1. As another example, the doping channel region 130_DO may overlap a part of the second_2 upper metallic line EL2 in the first direction D1, and may not overlap the second_1 upper metallic line EL1 in the first direction D1.

Although the first upper metallic line SSL and the second upper metallic line EL are shown as two separated metallic lines, the inventive concept is not limited thereto. As an example, only one of the first upper metallic line SSL and the second upper metallic line EL may include a plurality of metallic lines. As another example, the number of metallic lines included in the first upper metallic line SSL may be different from the number of metallic lines included in the second upper metallic line EL.

Figure 17:
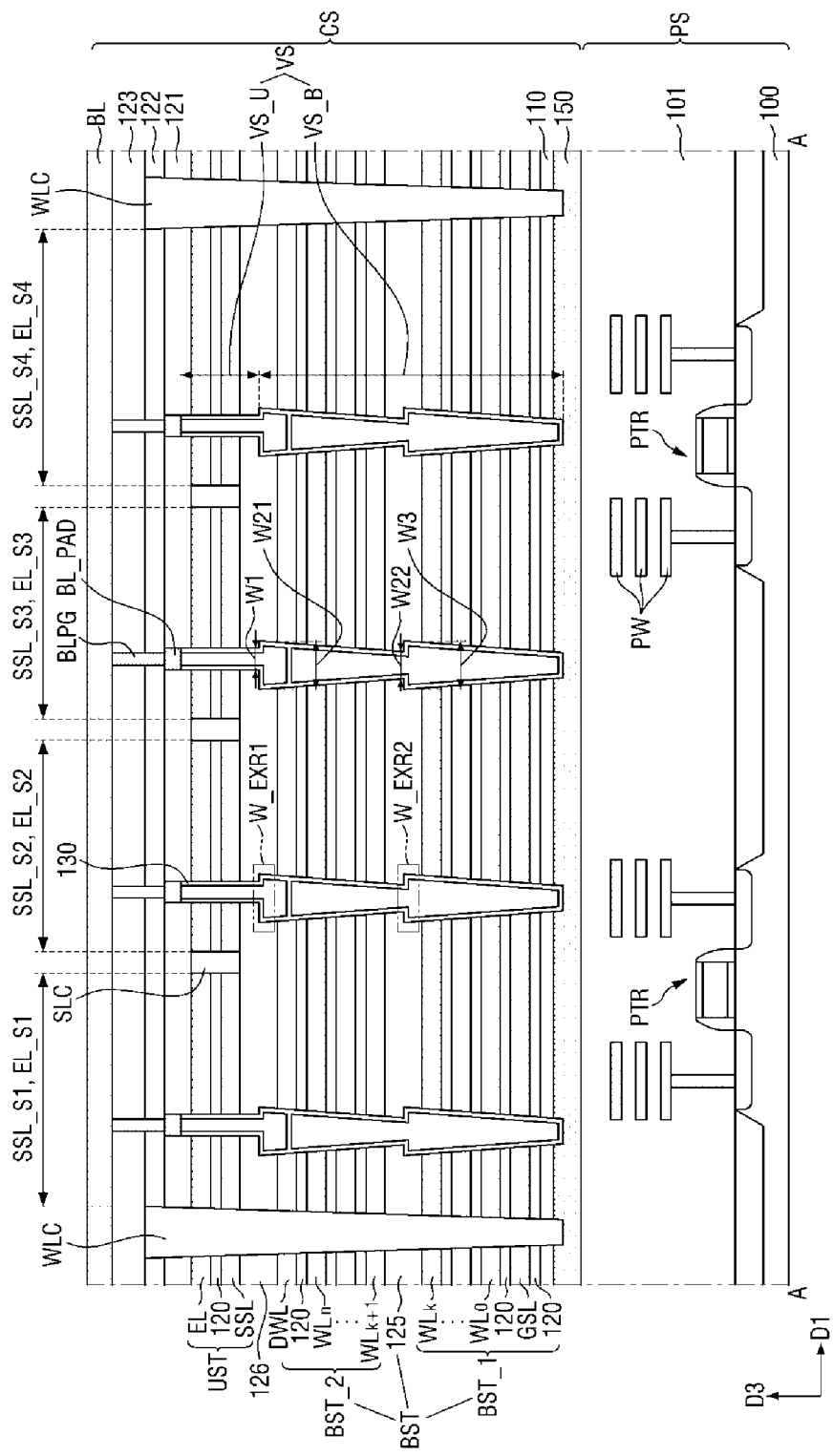
FIGS. 17 and 18 are respective cross diagram for explaining the semiconductor memory device according to some embodiments.
Figure 18:
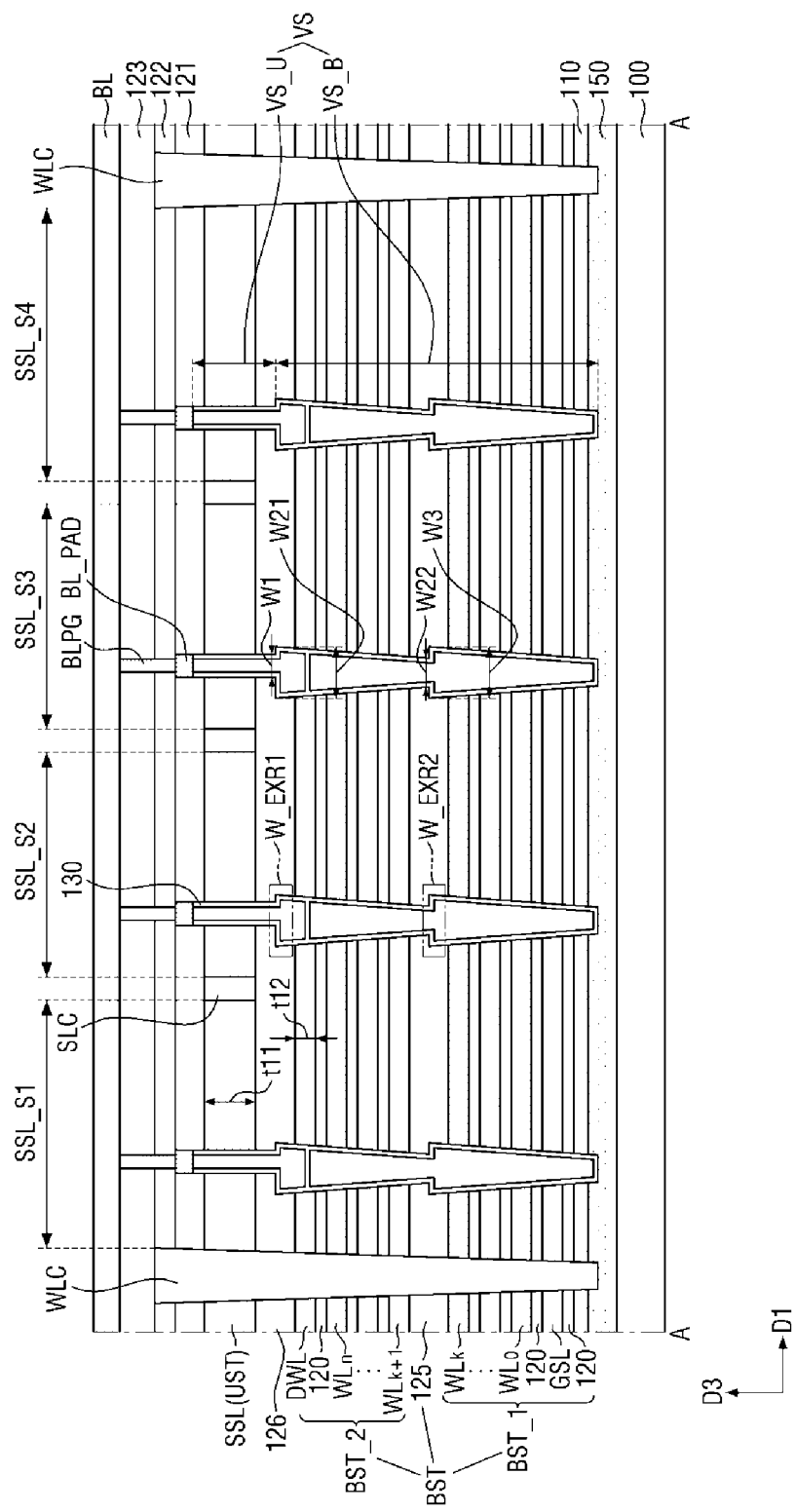

FIGS. 17 and 18 are respective cross-sectional diagrams illustrating semiconductor memory devices according to embodiments of the inventive concept. For convenience of description, differences between these embodiments and those described in relation to FIGS. 2, 3, 4A, 4B, 5A, 5B, 6A and 6B will be highlighted.

Referring to FIG. 17, certain semiconductor memory devices according to embodiments of the inventive concept may include a peripheral logic structure PS and a cell array structure CS.

The peripheral logic structure PS may include a peripheral circuit PTR, a lower connection wiring body PW, and a peripheral logic insulation film 101.

The peripheral circuit PTR may be formed on the substrate 100. The peripheral circuit PTR may be circuits for operating the cell array structure CS.

The peripheral logic insulation film 101 may be formed on the substrate 100. The peripheral logic insulation film 110 may include, for example, at least one of silicon oxide, silicon nitride, silicon oxynitride, and a low dielectric constant material.

The lower connection wiring body PW may be formed in the peripheral logic insulation film 101. The lower connection wiring body PW may be connected to the peripheral circuit PTR.

The cell array structure CS may be disposed on the peripheral logic structure PS. The cell array structure CS may include a lower stacked structure BST, an upper stacked structure UST, vertical structures VS, one or more sub-cutting lines SLC and bit lines BL.

The horizontal conductive substrate 150 may extend along the upper surface of the peripheral logic structure PS.

Referring to FIG. 18, the upper stacked structure UST may include a first upper metallic line SSL.

A thickness t11 of the first upper metallic line SSL may be greater than a thickness t12 of each of the lower metallic lines GSL, word lines $WL_0$ to $WL_n$ and DWL included in the lower stacked structure BST.

The first upper metallic line SSL may serve as the string selection line of FIG. 1, and may also serve as the erasing control line.

Figure 19:
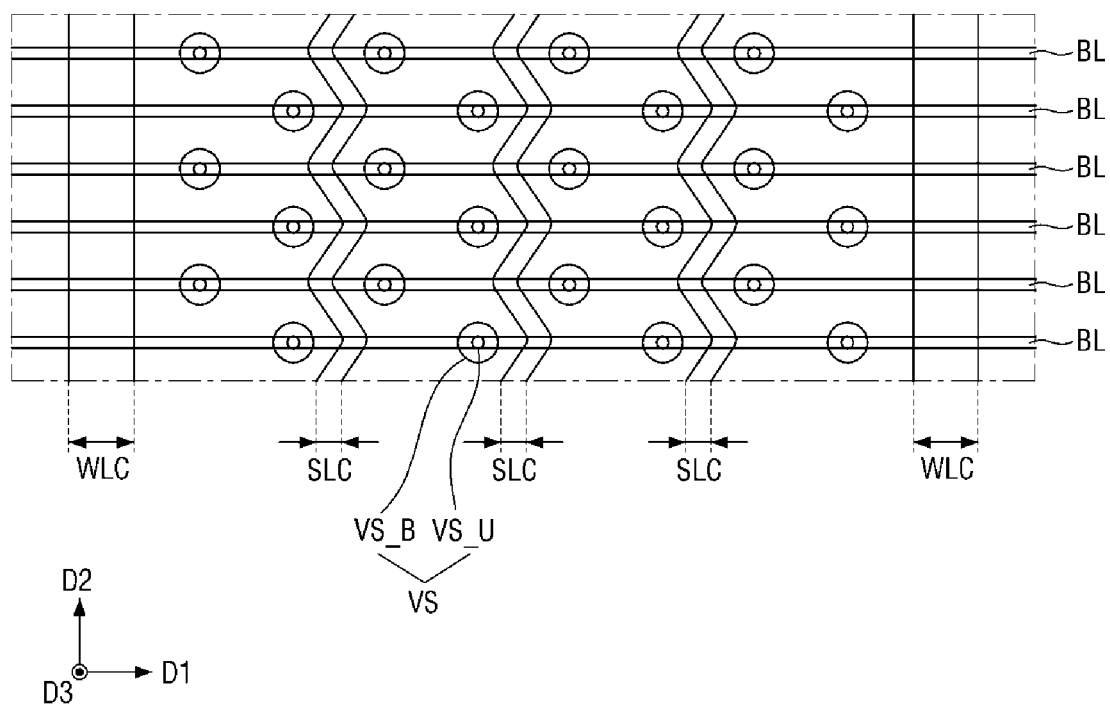
Figure 20:
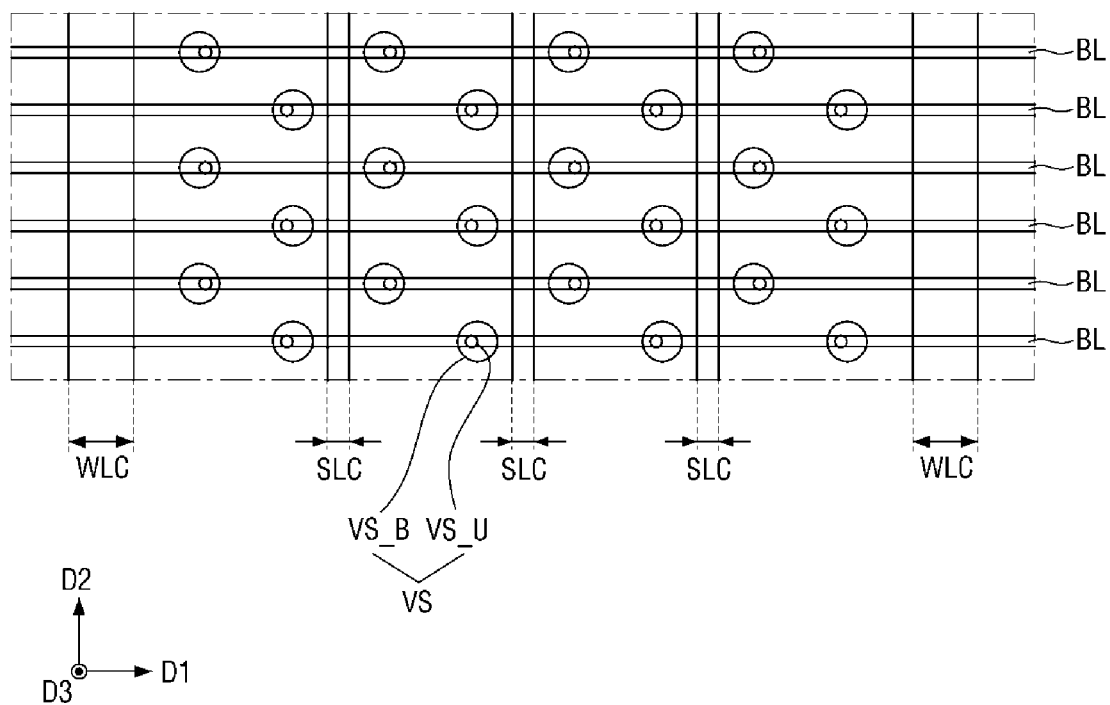
FIG. 20 is a layout diagram illustrating non-volatile memory devices according to embodiments of the inventive concept.

FIGS. 19 and 20 are respective layout diagrams illustrating a non-volatile memory device according to embodiments of the inventive concept. For convenience of description, differences between these embodiments and those described in relation to FIGS. 2, 3, 4A, 4B, 5A, 5B, 6A and 6B will be highlighted.

Referring to FIG. 19, the center of the upper vertical structure VS_U may coincide with the center of the lower vertical structure VS_B.

Referring to FIG. 20, the sub-cutting line SLC may have a straight (or linear) pattern (as compared with the zigzag pattern of FIG. 2) extending in the second direction D2.

Figure 21:
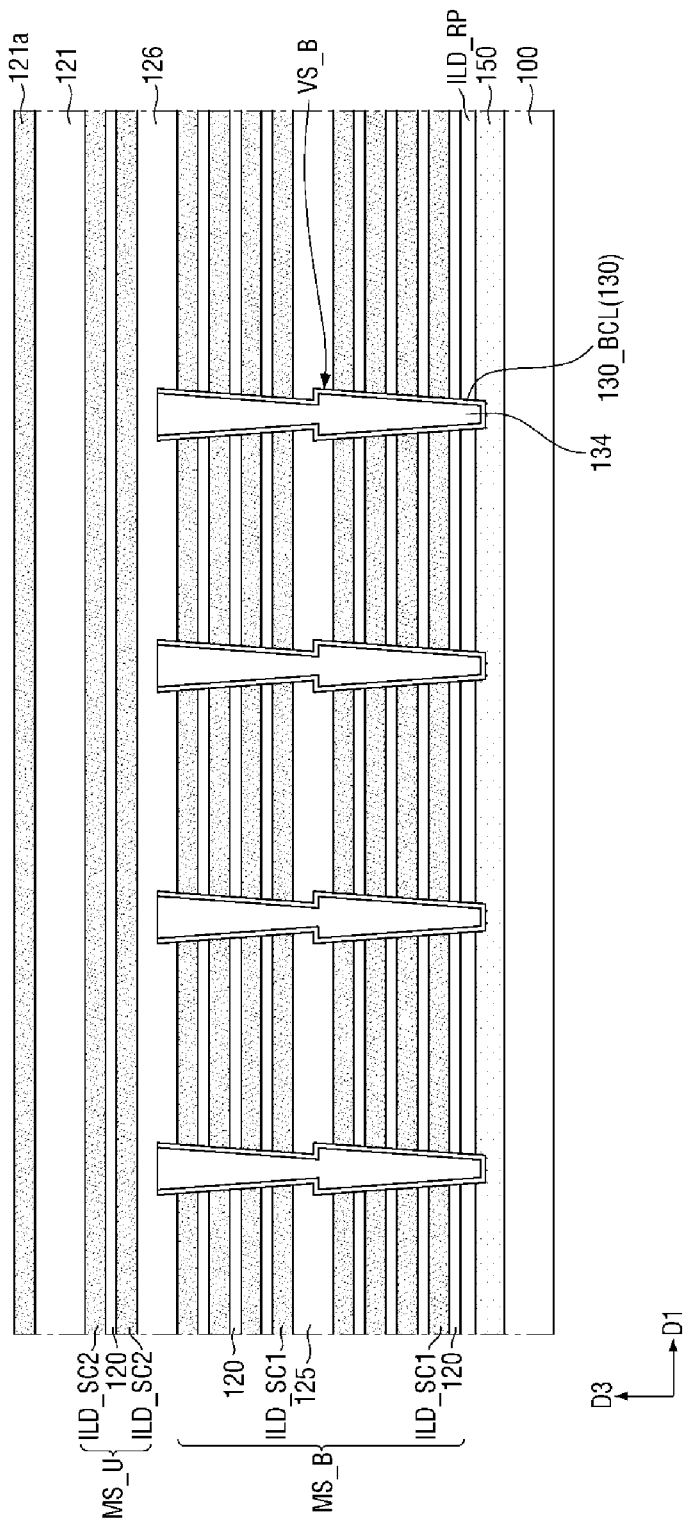
Figure 22:
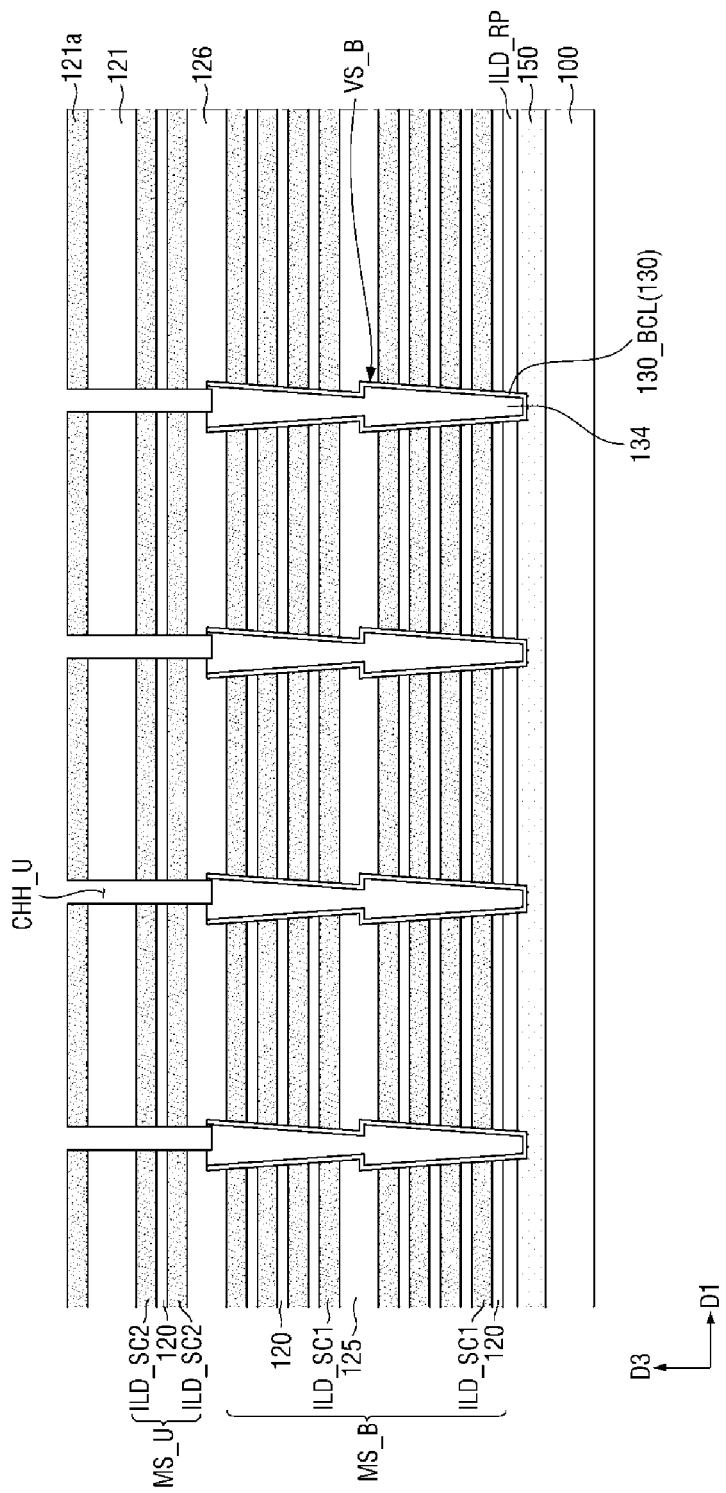
Figure 23A:
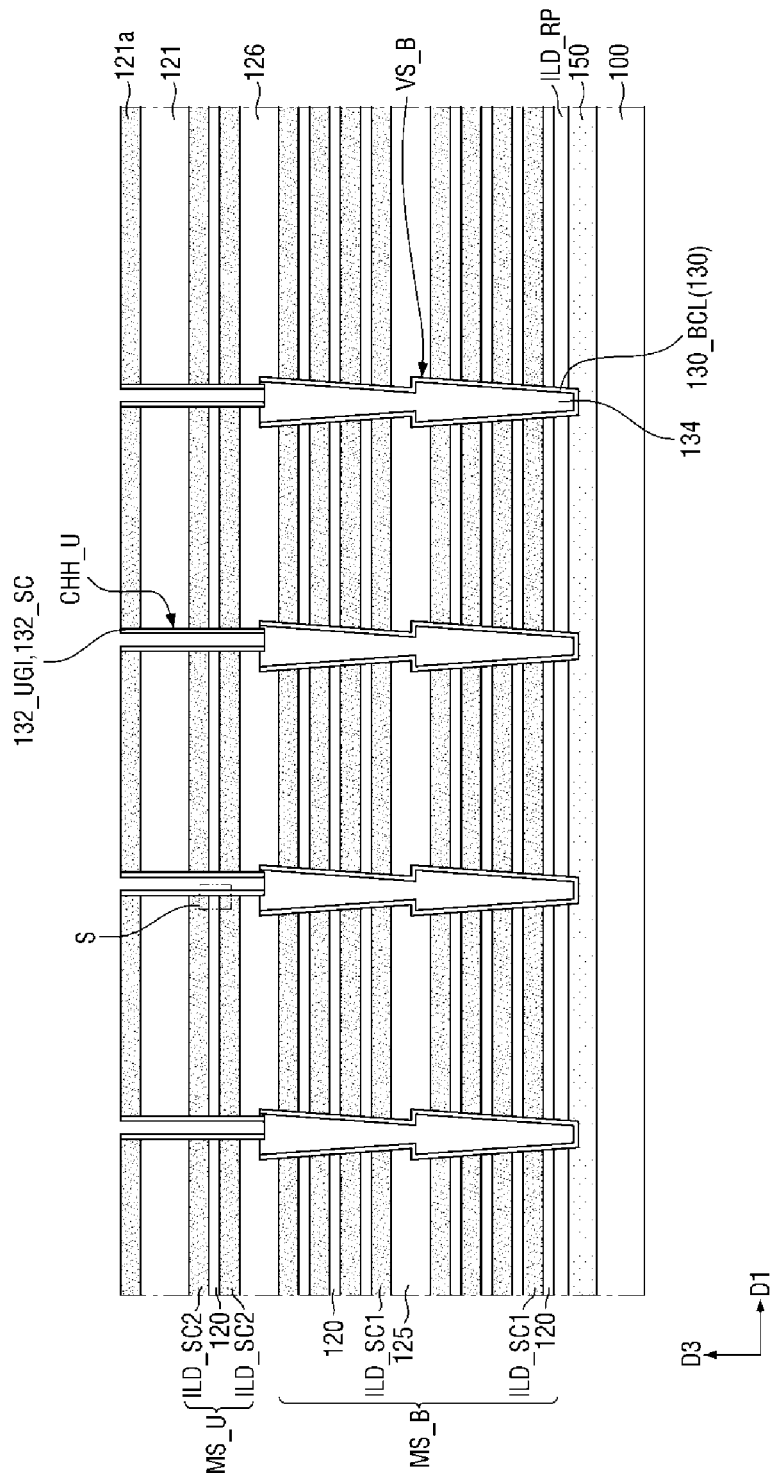
Figure 23B:
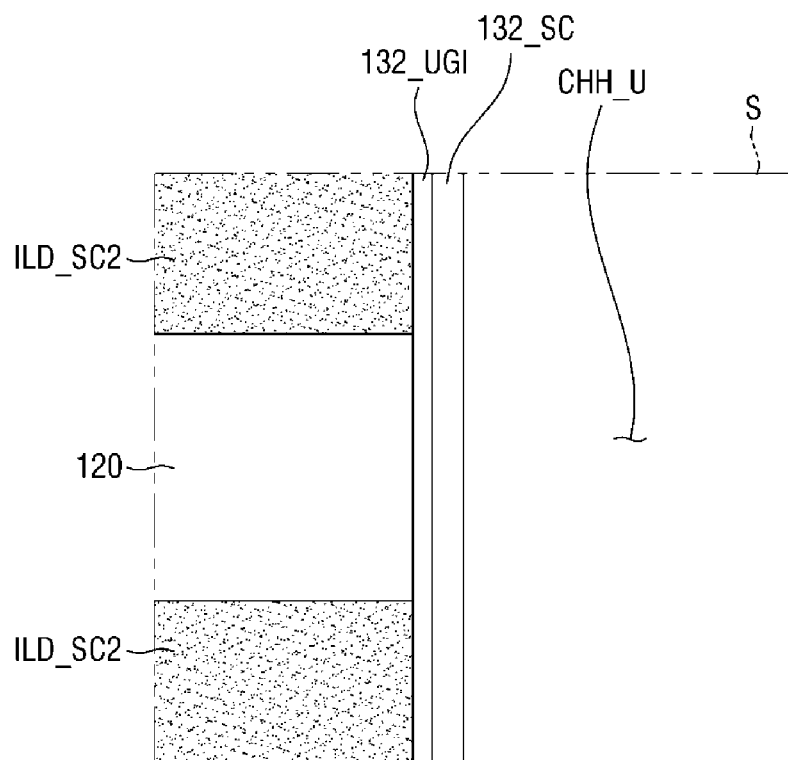
Figure 24:
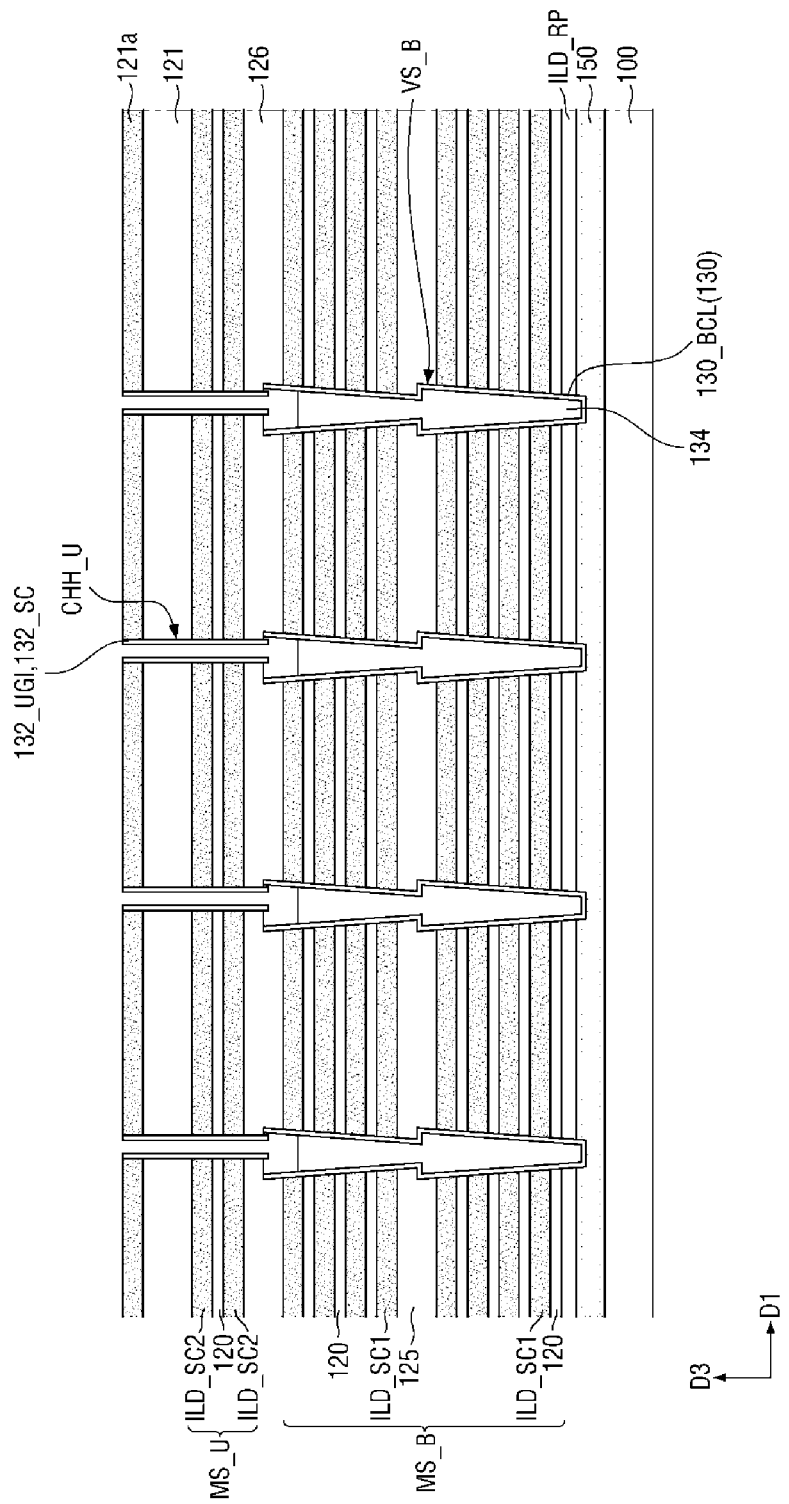
Figure 25A:
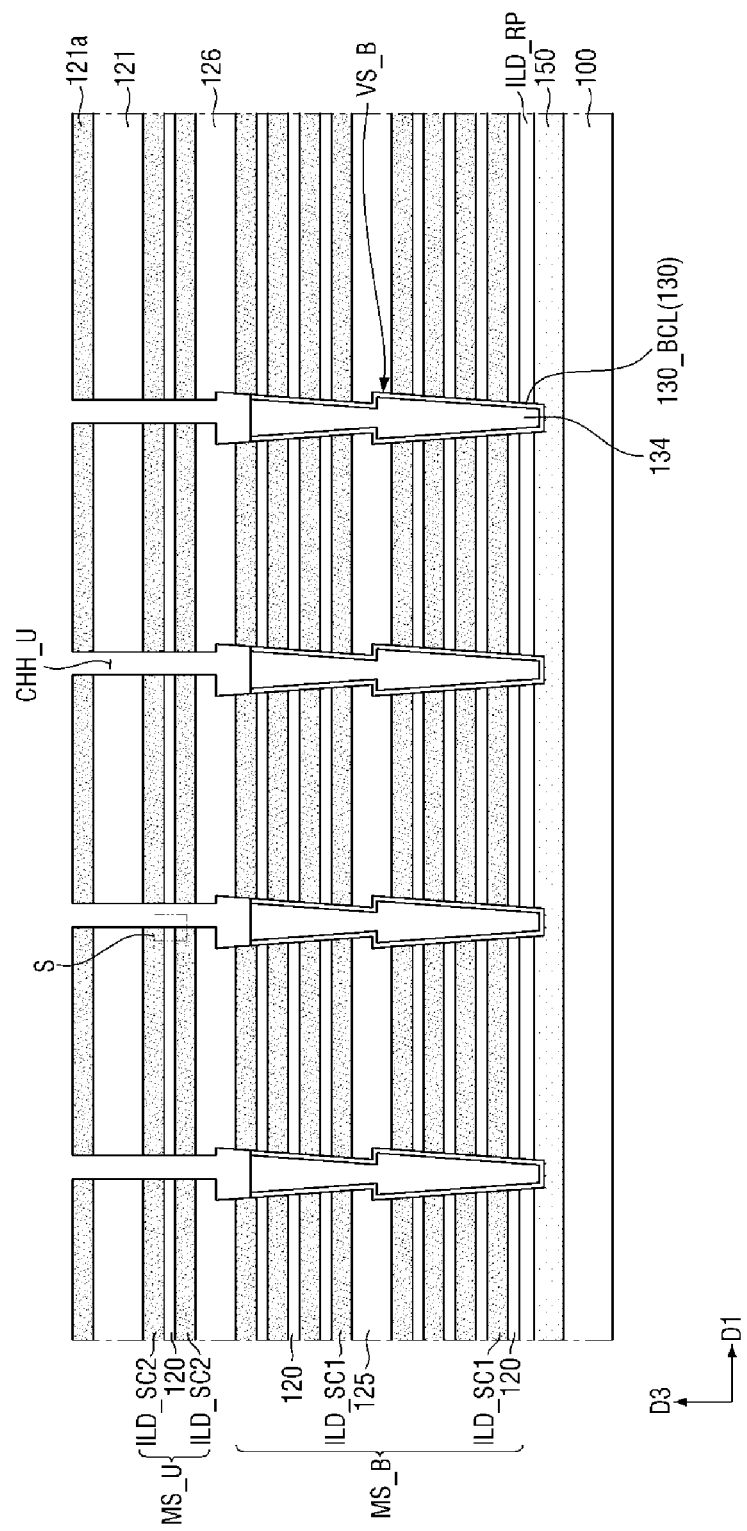
Figure 25B:
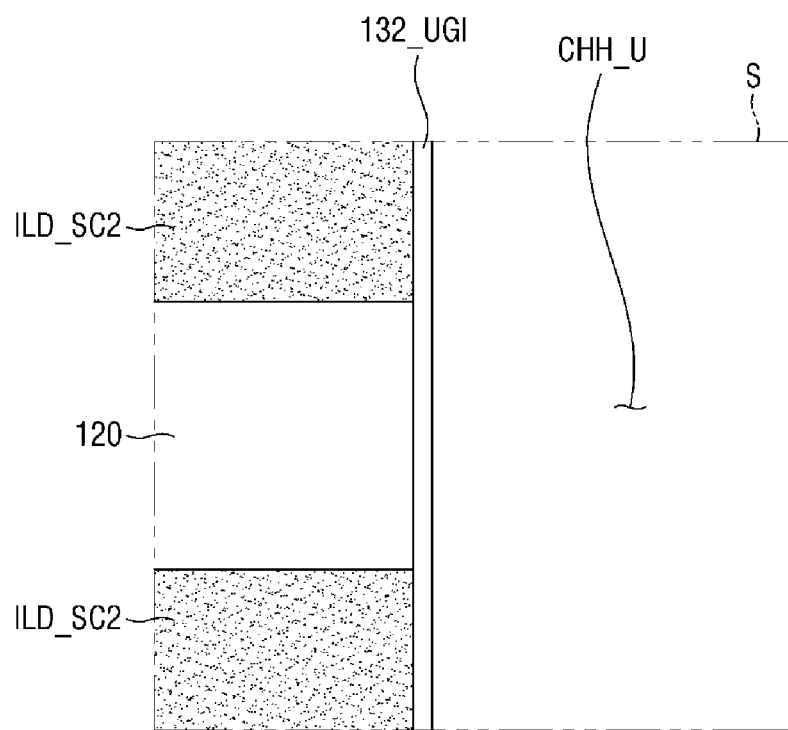

FIGS. 21, 22, 23A, 23B, 24, 25A, 25B, 26, 27, 28 and 29 are related, cross-sectional diagrams illustrating in one example a method of fabricating a semiconductor memory device according to embodiments of the inventive concept. Here, FIGS. 23B and 25B are enlarged views further illustrating the region 'S' of FIGS. 23A and 25A, respectively.

Referring to FIG. 21, a horizontal conductive substrate 150 and an alternative insulation film ILD_RP may be sequentially formed on the substrate 100.

A lower mold film MS_B in which inter-electrode insulation films 120 and 125 and the lower sacrificial films ILD_SC1 are alternately stacked may be formed on the alternative insulation film ILD_RP.

Next, a lower vertical structure VS_B including a lower vertical channel film 130_BCL may be formed in the lower mold film MS_B.

More specifically, a part of the lower mold film MS_B in which the inter-electrode insulation film 120 and the lower sacrificial film ILD_SC1 are alternately stacked may be formed on the alternative insulation film ILD_RP. Next, after forming a first lower channel hole for forming the lower vertical structure VS_B, a sacrificial pattern may fill the first lower channel hole.

After forming the sacrificial pattern, the remainder of the lower mold film MS_B in which the inter-electrode insulation films 120 and 125 and the lower sacrificial film ILD_SC1 are alternately stacked may be formed. Next, a second lower channel hole, which is arranged in the first lower channel hole and exposes the sacrificial pattern in the first lower channel hole, may be formed in the remainder of the lower mold film MS_B.

After removing the sacrificial pattern in the first lower channel hole, the lower vertical channel film 130_BCL and the vertical insulation pattern 134 may be formed in the first lower channel hole and the second lower channel hole. A lower channel insulation film (e.g., 132_BGI of FIGS. 4A and 6A) is formed between the lower vertical channel film 130_BCL and the lower mold film MS_B. For example, the lower vertical channel film 130_BCL may include, but is not limited to, a polycrystalline silicon film.

Accordingly, the lower vertical structure VS_B may be formed in the lower mold film MS_B.

Subsequently, the inter-structure insulation film 126 and the upper mold film MS_U may be formed on the lower mold film MS_B having the lower vertical structure VS_B formed thereon. The upper mold film MS_U may include an inter-electrode insulation film 120 and an upper sacrificial film ILD_SC2 that are alternately stacked.

A first interlayer insulation film 121 and a mask film 121*a* may be formed on the upper mold film MS_U.

For example, the upper sacrificial film ILD_SC2 and the lower sacrificial film ILD_SC1 may be the same material.

Referring to FIG. 22, an upper channel hole CHH_U may be formed in the upper mold film MS_U.

The upper channel hole CHH_U may penetrate the upper mold film MS_U. The upper channel hole CHH_U may vertically overlap the lower vertical structure VS_B. That is, the upper channel hole CHH_U may be arranged with the lower vertical structure VS_B in the third direction D3.

Referring to FIGS. 23A and 23B, an upper channel insulation film 132_UGI and a sacrificial polysilicon film 132_SC may be sequentially formed along the sidewalls of the upper channel hole CHH_U.

The upper channel insulation film 132_UGI and the sacrificial polysilicon film 132_SC may expose the vertical insulation pattern 134.

Referring to FIG. 24, a part of the vertical insulation pattern 134 may be removed to form a space in the lower vertical structure VS_B.

By removing a part of the vertical insulation pattern 134, a part of the lower vertical channel film 130_BCL may be exposed.

Referring to FIGS. 25A and 25B, the sacrificial polysilicon film 132_SC and the exposed lower vertical channel film 130_BCL may be removed.

The upper channel insulation film 132_UGI may not be removed while the sacrificial polysilicon film 132_SC is being removed. That is, the upper channel insulation film 132_UGI may remain on the sidewall of the upper channel hole CHH_U.

Figure 26:
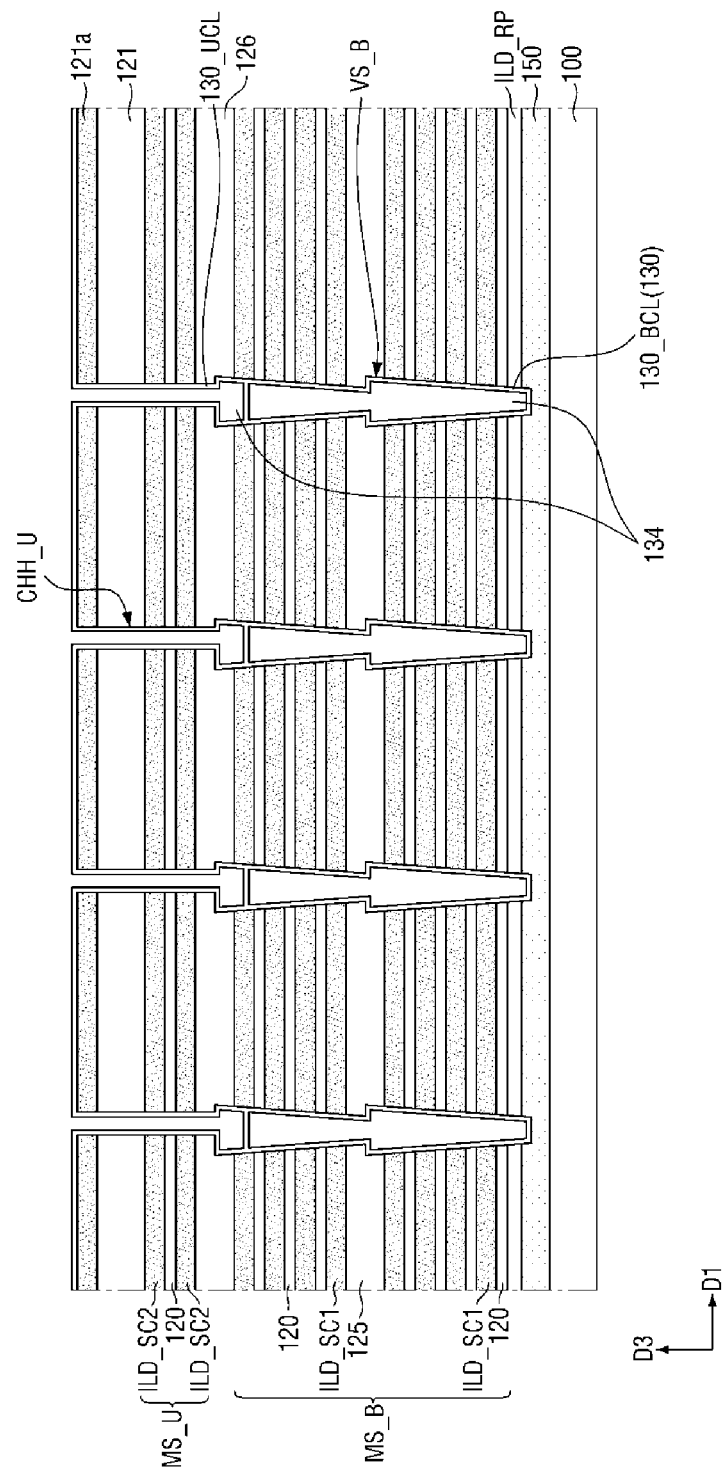

Referring to FIG. 26, the upper vertical channel film 130_UCL may be formed on the upper channel insulation film 132_UGI.

The upper vertical channel film 130_UCL may extend along the sidewalls of the upper channel hole CHH_U. The upper vertical channel film 130_UCL may be connected to the lower vertical channel film 130_BCL in the lower vertical structure VS_B.

The upper vertical channel film 130_UCL may extend along the upper surface of the mask film 121a.

Figure 27:
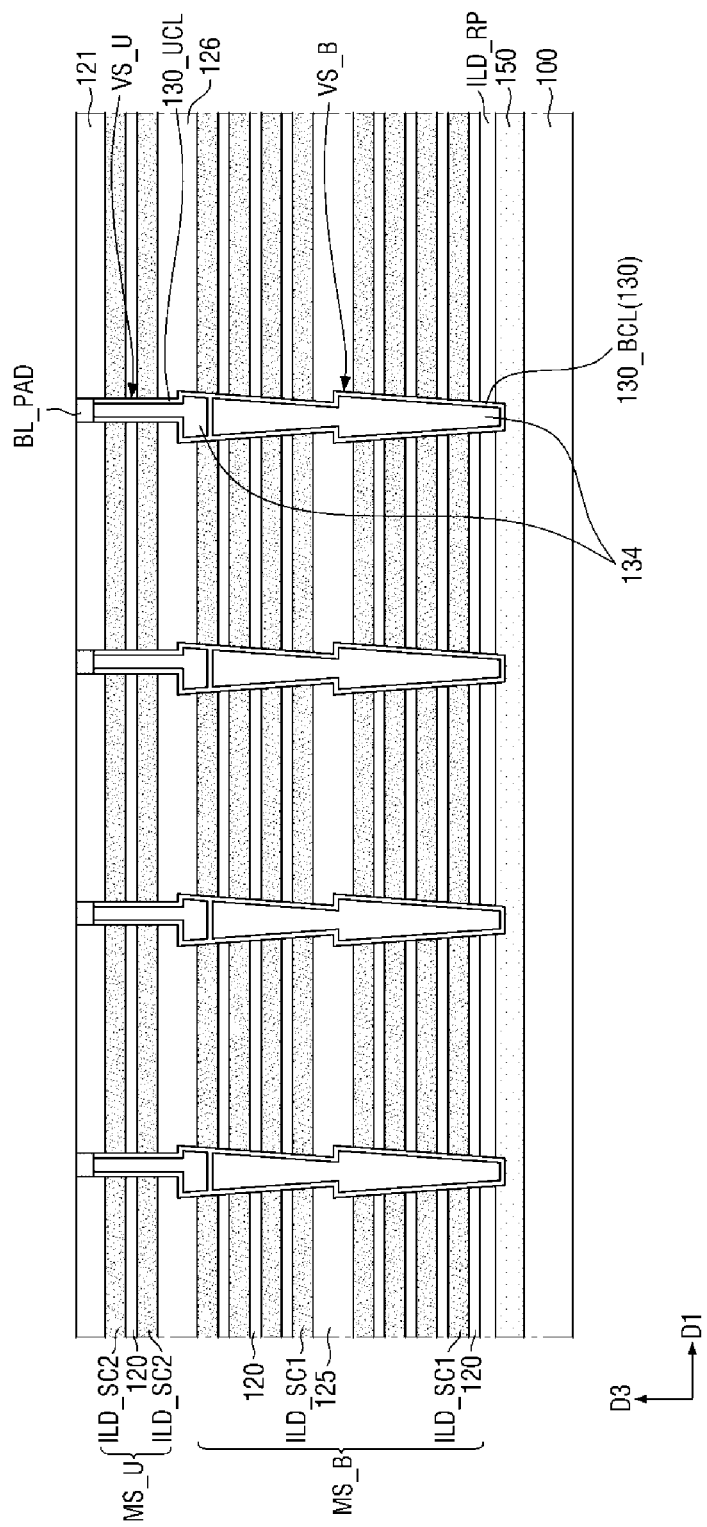

Referring to FIG. 27, a vertical insulation pattern 134 which fills a part of the upper channel hole CHH_U may be formed on the upper vertical channel film 130_UCL.

Next, a bit line pad BL_PAD which is in contact with the upper vertical channel film 130_UCL may be formed on the vertical insulation pattern 134 and the upper vertical channel film 130_UCL.

Next, the mask film 121a and a part of the first interlayer insulation film 121 may be removed.

Next, the bit line pad BL_PAD may be doped with N-type impurities to form a bit line pad BL_PAD doped with the N-type impurities.

In FIG. 4A, while the bit line pad BL_PAD doped with the N-type impurities is formed, a part of the upper vertical channel film 130_UCL may be converted into a doping channel region 130_DO doped with the N-type impurities.

Figure 28:
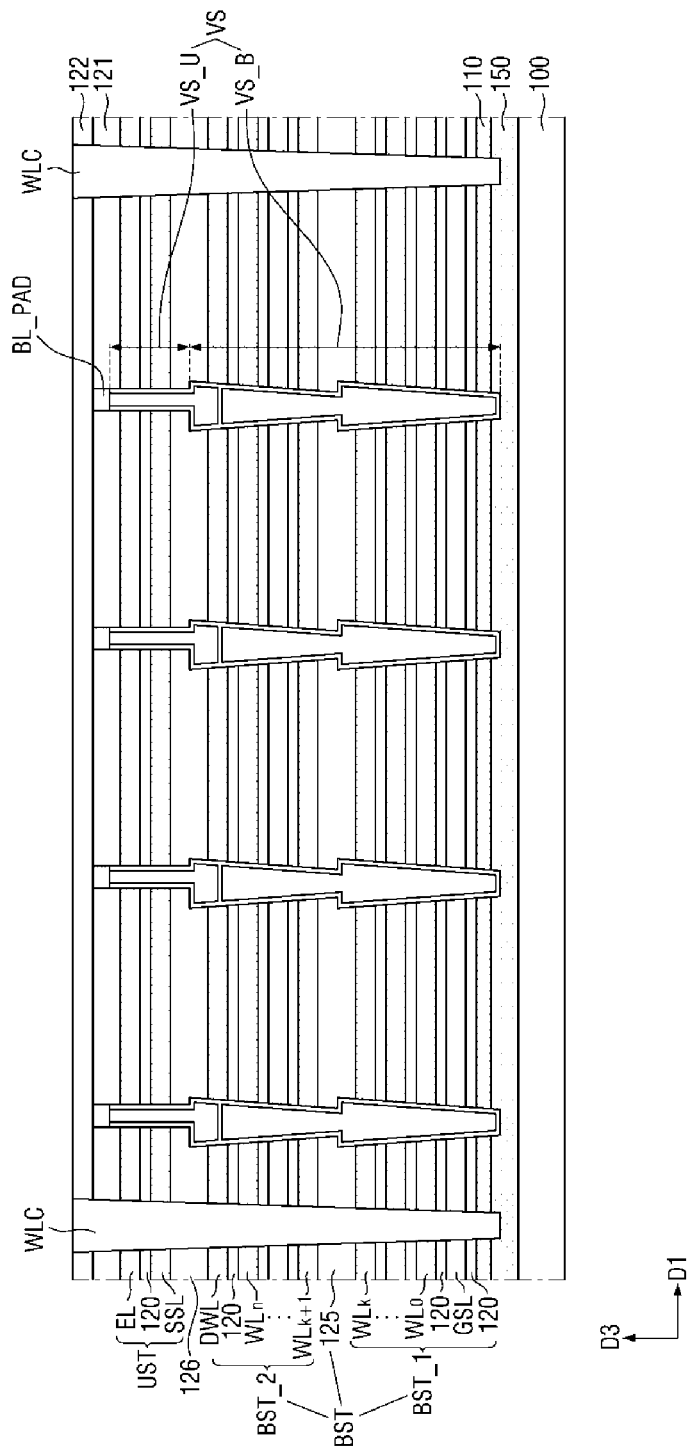

Referring to FIG. 28, a second interlayer insulation film 122 which covers the bit line pad BL_PAD may be formed on the first interlayer insulation film 121.

Next, a cutting line trench WCL_T which cuts the first and second interlayer insulation films 121 and 122, the upper mold film MS_U and the lower mold film MS_B may be formed.

After forming the cutting line trench WCL_T, the alternative insulation film ILD_RP may be removed. The vertical structure support film 110 may be formed in the space from which the alternative insulation film ILD_RP is removed.

After forming the cutting line trench WCL_T, the upper sacrificial film ILD_SC2 and the lower sacrificial film ILD_SC1 may be removed. In the space from which the upper sacrificial film ILD_SC2 and the lower sacrificial film ILD_SC1 are removed, the lower metallic lines GSL, word lines $WL_0$ to $WL_n$ and DWL, the first upper metallic line SSL and the second upper metallic line EL may be formed.

That is, the upper sacrificial film ILD_SC2 and the lower sacrificial film ILD_SC1 may be redisposed with the lower metallic lines GSL, word lines $WL_0$ to $WL_n$ and DWL, the first upper metallic line SSL and the second upper metallic line EL through a replacement metal gate process.

Subsequently, an insulation line WLC which fills the cutting line trench WCL_T may be formed.

Figure 29:
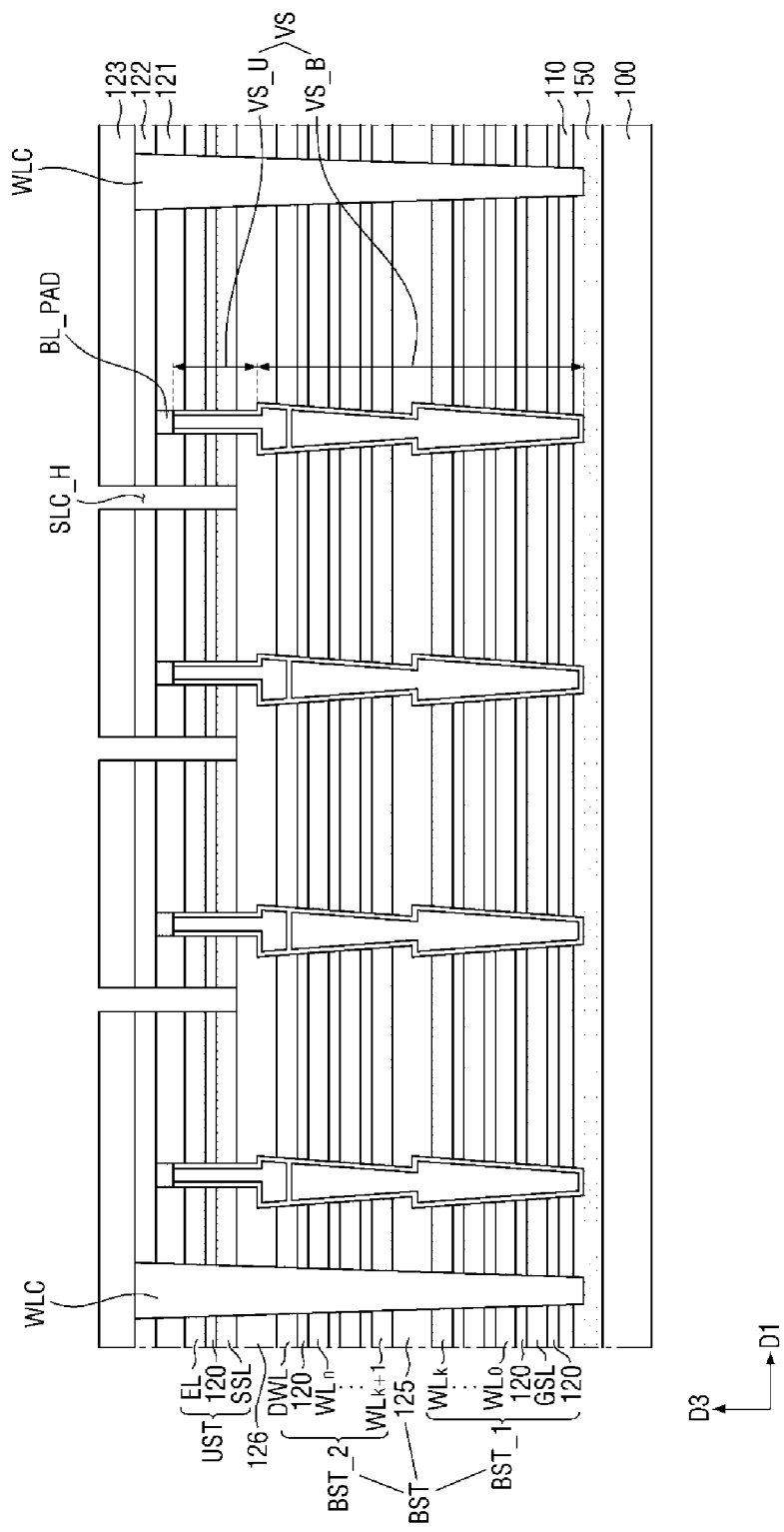

Referring to FIG. 29, the third interlayer insulation film 123 may be formed on the insulation line WLC and the second interlayer insulation film 122.

Next, a sub-cutting line trench SLC_H for cutting the first upper metallic line SSL and the second upper metallic line EL may be formed.

Subsequently, (referring e.g., to FIG. 3) a sub-cutting line SLC that fills the sub-cutting line trench SLC_H may be formed. Also, a bit line BL may be formed on the third interlayer insulation film 123.

Alternately, as illustrated in FIG. 21, a lower vertical channel film 130_BCL which covers the upper surface of the vertical insulation pattern 134 may be additionally formed. In such a case, the channel film 130 as shown in FIGS. 8 and 9 may be formed.

Further, in FIG. 21, the lower vertical channel film 130_BCL may not be formed. In such a case, the lower vertical channel film 130_BCL and the upper vertical channel film 130_UCL may be simultaneously formed through the process described in FIG. 26. In such a case, a channel film 130 as shown in FIGS. 10 and 11 may be formed. Those skilled in the art will appreciate that many variations and modifications may be made to the illustrated embodiments without substantially departing from the scope of the inventive concept.

What is claimed is:

1. A semiconductor memory device comprising:
   a lower stacked structure including lower metallic lines stacked in a first direction on a substrate;
   an upper stacked structure including a first upper metallic line and a second upper metallic line sequentially on the lower stacked structure;
   a vertical structure penetrating the upper stacked structure and lower stacked structure and including a channel film;
   a connection pad disposed on the vertical structure, contacted with the channel film;
   a first cutting line cutting the lower metallic lines, the first upper metallic line and the second upper metallic line;
   a second cutting line spaced apart from the first cutting line in a second direction different from the first direction, and cutting the lower metallic lines, the first upper metallic line and the second upper metallic line; and
   sub-cutting lines cutting the first upper metallic line and the second upper metallic line between the first cutting line and the second cutting line,
   wherein the channel film includes an undoped channel region and a doping channel region doped with N-type impurities, and
   the doping channel region contacts the connection pad and overlaps a part of the second upper metallic line in the second direction.

2. The semiconductor memory device of claim 1, wherein the doping channel region does not overlap the first upper metallic line at the lowermost part of the upper stacked structure.

3. The semiconductor memory device of claim 1, wherein the vertical structure comprises a lower vertical structure disposed in the lower stacked structure and an upper vertical structure disposed in the upper stacked structure.

4. The semiconductor memory device of claim 3, wherein the upper vertical structure includes a first sidewall, a second sidewall opposite the first sidewall, and a first center line between the first sidewall and the second sidewall, and extending in the first direction, wherein a distance between the first center line and the first sidewall is same as a distance between the first center line and the second sidewall, wherein the lower vertical structure includes a third sidewall, a fourth sidewall opposite the third sidewall, and a second center line between the third sidewall and the fourth sidewall, and extending in the first direction, wherein a distance between the second center line and the third sidewall is same as a distance between the second center line and the fourth sidewall, and wherein a first distance between the sub-cutting lines and the first center line in the second direction is different from a second distance between the sub-cutting lines and the second center line in the second direction.

5. The semiconductor memory device of claim 3, wherein a width of the upper vertical structure in the second direction is less than a width of the lower vertical structure in the second direction at a boundary between the upper vertical structure and the lower vertical structure.

6. The semiconductor memory device of claim 3, wherein the lower stacked structure comprises a first sub-lower structure and a second-sub-lower structure on the first sub-lower structure.

7. The semiconductor memory device of claim 1, wherein the undoped channel region comprises a vertical extension region extending in the first direction, and a horizontal extension region extending in the second direction, wherein the horizontal extension region is connected to the vertical extension region, wherein the horizontal extension region includes a first portion overlapped the upper vertical structure, and a second portion which is not overlapped the upper vertical structure, and wherein a thickness of the first portion of the horizontal extension region is greater than a thickness of the second portion of the horizontal extension region.

8. The semiconductor memory device of claim 1, wherein a first distance in the first direction between an upper surface of the substrate and an upper surface of the first cutting line is greater than a second distance in the first direction between the upper surface of the substrate and an upper surface of the vertical structure.

9. The semiconductor memory device of claim 8, wherein a third distance in the first direction between the upper surface of the substrate and an upper surface of the sub-cutting lines is less than the second distance.

10. The semiconductor memory device of claim 1, wherein the vertical structure comprises a vertical insulation pattern which fills a space defined by the channel film, and wherein an air gap is formed in the vertical insulation pattern.

11. The semiconductor memory device of claim 1, wherein the sub-cutting lines have a wave pattern in a plan view.

12. A semiconductor memory device comprising:

a lower stacked structure including lower metallic lines stacked in a first direction on a substrate;

an upper stacked structure including a first upper metallic line and a second upper metallic line sequentially stacked on the lower stacked structure;

a vertical structure penetrating the upper stacked structure and lower stacked structure and including a channel film;

a connection pad disposed on the vertical structure, contacted with the channel film;

a first cutting line cutting the lower metallic lines, the first upper metallic line and the second upper metallic line;

a second cutting line spaced apart from the first cutting line in a second direction different from the first direction, and cutting lower metallic lines, the first upper metallic line and the second upper metallic line; and sub-cutting lines cutting the first upper metallic line and the second upper metallic line between the first cutting line and the second cutting line, wherein the channel film includes an undoped channel region and a doping channel region doped with N-type impurities, a doping channel region of the channel film contacts the connection pad and overlaps a part of the second upper metallic line in the second direction, the lower metallic lines includes a first lower metallic line closest to the first upper metallic line, the undoped channel region includes an upper extension region and a lower extension region extending in the first direction, and a horizontal extension region which connects the upper extension region and the lower extension region and extends in the second direction, and the horizontal extension region is connected to the upper extension region and the lower extension region, between a lower surface of the first lower metallic line and a lower surface of the first upper metallic line.

13. The semiconductor memory device of claim 12, wherein the lower metallic lines, the first upper metallic line and the second upper metallic line include a filling conductive film on the channel film, and a barrier conductive film between the channel film and the filling conductive film, respectively.

14. The semiconductor memory device of claim 13, wherein the barrier conductive film of the second upper metallic line does not extend along a boundary between the sub-cutting line and the filling conductive film of the second upper metallic line.

15. The semiconductor memory device of claim 14, wherein a part of the sub-cutting line protrudes in the second direction and indent between the second upper metallic line and the first upper metallic line.

16. The semiconductor memory device of claim 12, wherein the second upper metallic line comprises a first sub-upper metallic line and a second sub-upper metallic line spaced apart from the first sub-upper metallic line in the first direction, and wherein at least part of the first sub-upper metallic line overlaps with the doping channel region.

17. The semiconductor memory device of claim 12, wherein the vertical structure comprises a lower vertical structure disposed in the lower stacked structure and an upper vertical structure disposed in the upper stacked structure, wherein the upper vertical structure includes a first sidewall, a second sidewall opposite the first sidewall, and a first center line between the first sidewall and the second sidewall, and extending in the first direction, wherein a distance between the first center line and the first sidewall is same as a distance between the first center line and the second sidewall, wherein the lower vertical structure includes a third sidewall, a fourth sidewall opposite the third sidewall, and a second center line between the third sidewall and the fourth sidewall, and extending in the first direction, wherein a distance between the second center line and the third sidewall is same as a distance between the second center line and the fourth sidewall, and wherein a first distance between the sub-cutting lines and the first center line in the second direction is different from a second distance between the sub-cutting lines and the second center line in the second direction.

18. The semiconductor memory device of claim 17, wherein the lower stacked structure comprises a first sub-lower structure and a second-sub-lower structure on the first sub-lower structure.

19. A semiconductor memory device comprising:

a peripheral logic structure including a peripheral circuit on a substrate;

a horizontal conductive substrate extending along an upper surface of the peripheral logic structure;

a lower stacked structure including lower metallic lines stacked in a first direction, on the horizontal conductive substrate;

an upper stacked structure including a first upper metallic line and a second upper metallic line sequentially stacked on the lower stacked structure;

a vertical structure penetrating the upper stacked structure and the lower stacked structure and including a channel film, the channel film being electrically connected to the horizontal conductive substrate;

a connection pad disposed on the vertical structure, contacted with the channel film;

a first cutting line cutting the lower metallic lines, the first upper metallic line and the second upper metallic line;

a second cutting line spaced apart from the first cutting line in a second direction different from the first direction, and cutting the lower metallic lines, the first upper metallic line and the second upper metallic line; and sub-cutting lines cutting the first upper metallic line and the second upper metallic line between the first cutting line and the second cutting line, wherein the sub-cutting lines do not cut the lower metallic line, the channel film includes an undoped channel region and a doping channel region doped with N-type impurities, the doping channel region of the channel film contacting the connection pad and overlapping a part of the second upper metallic line in the second direction, and the vertical structure includes a plurality of width extension regions having respective widths that increase in the second direction as the vertical structure extends away from the connection pad.

20. The semiconductor memory device of claim 19, wherein the vertical structure comprises a lower vertical structure disposed in the lower stacked structure and an upper vertical structure disposed in the upper stacked structure, wherein the upper vertical structure includes a first sidewall, a second sidewall opposite the first sidewall, and a first center line between the first sidewall and the second sidewall, and extending in the first direction, wherein a distance between the first center line and the first sidewall is same as a distance between the first center line and the second sidewall, wherein the lower vertical structure includes a third sidewall, a fourth sidewall opposite the third sidewall, and a second center line between the third sidewall and the fourth sidewall, and extending in the first direction, wherein a distance between the second center line and the third sidewall is same as a distance between the second center line and the fourth sidewall, and wherein a first distance between the sub-cutting lines and the first center line in the second direction is different from a second distance between the sub-cutting lines and the second center line in the second direction.

* * * * *